United States Patent
Lin et al.

(10) Patent No.: US 11,903,186 B2
(45) Date of Patent: Feb. 13, 2024

(54) METHOD FOR MANUFACTURING SEMICONDUCTOR DEVICE WITH BIT LINE CONTACTS OF DIFFERENT PITCHES

(71) Applicant: NANYA TECHNOLOGY CORPORATION, New Taipei (TW)

(72) Inventors: Yu-Ting Lin, New Taipei (TW); Huei-Ru Lin, Toufen (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 120 days.

(21) Appl. No.: 17/726,004

(22) Filed: Apr. 21, 2022

(65) Prior Publication Data
US 2023/0345709 A1  Oct. 26, 2023

(51) Int. Cl.
*H10B 12/00* (2023.01)

(52) U.S. Cl.
CPC ......... *H10B 12/485* (2023.02); *H10B 12/033* (2023.02); *H10B 12/053* (2023.02); *H10B 12/315* (2023.02); *H10B 12/34* (2023.02); *H10B 12/482* (2023.02)

(58) Field of Classification Search
None
See application file for complete search history.

(56) References Cited

U.S. PATENT DOCUMENTS

| 2006/0281250 A1 | 12/2006 | Schloesser |
| 2018/0350833 A1 | 12/2018 | Lee et al. |
| 2019/0051654 A1* | 2/2019 | Chang ................ H10B 12/0335 |

FOREIGN PATENT DOCUMENTS

TW  201436193 A  9/2014

* cited by examiner

*Primary Examiner* — Hsien Ming Lee
(74) *Attorney, Agent, or Firm* — Muncy, Geissler, Olds & Lowe, P.C.

(57) ABSTRACT

A semiconductor device and method for manufacturing the same are provided. The method includes providing a substrate including a plurality of active areas separated from each other. In some embodiments, the method also includes forming first mask structures on the substrate. In some embodiments, the method further includes forming a first protective layer covering the first mask structures and the substrate. In some embodiments, the first protective layer defines an area exposing a portion of the first mask structures and the substrate, and the area defined by the first protective layer has a zigzag edge in a top view. In addition, the method includes performing a first etching process to remove a portion of the substrate exposed from the first mask structures and the first protective layer to form trenches.

20 Claims, 24 Drawing Sheets

METHOD FOR MANUFACTURING SEMICONDUCTOR DEVICE WITH BIT LINE CONTACTS OF DIFFERENT PITCHES

TECHNICAL FIELD

The present disclosure relates to a method for manufacturing a semiconductor device, and more particularly, to a method using a protective layer to form bit line contacts of different pitches.

DISCUSSION OF THE BACKGROUND

With the rapid growth of the electronics industry, integrated circuits (ICs) have achieved high performance and miniaturization. Technological advances in IC materials and design have produced generations of ICs in which each successive generation has smaller and more complex circuits.

Bit line contacts are used to make connections in or among different features in a semiconductor structure. The bit line contact may be formed in a trench defined by a substrate. The substrate may be chopped to form a trench within which the bit line contact is formed. In some situations, the trench in an edge of a cell region may have only a half profile compared with another in a relatively central region. However, such trenches with half profile can experience electrical leakage between a bit line and a cell contact. Therefore, a new semiconductor device and method of improving such problems is required.

This Discussion of the Background section is provided for background information only. The statements in this Discussion of the Background are not an admission that the subject matter disclosed herein constitutes prior art with respect to the present disclosure, and no part of this Discussion of the Background may be used as an admission that any part of this application constitutes prior art with respect to the present disclosure.

SUMMARY

One aspect of the present disclosure provides a method of manufacturing a semiconductor device. The method includes providing a substrate including a plurality of active areas separated from each other. The method also includes forming first mask structures on the substrate. The method further includes forming a first protective layer covering the first mask structures and the substrate. The first protective layer defines an area exposing a portion of the first mask structures and the substrate, and the area defined by the first protective layer has a zigzag edge in a top view. In addition, the method includes performing a first etching process to remove a portion of the substrate exposed from the first mask structures and the first protective layer to form trenches.

Another aspect of the present disclosure provides another method of manufacturing a semiconductor device. The method includes providing a substrate including a plurality of active areas separated from each other. The method also includes forming first mask structures on the substrate. The method further includes forming a first protective layer covering the first mask structures and the substrate. The first protective layer defines a first region exposing the first mask structures and the substrate. A portion of the first mask structures is partially covered by the first protective layer. In addition, the method includes performing a first etching process to remove a portion of the substrate exposed from the first mask structures and the first protective layer to form trenches.

Another aspect of the present disclosure provides a semiconductor device. The semiconductor device includes a substrate and a plurality of bit line contacts. The substrate defines a plurality of trenches. The plurality of bit line contacts are disposed on the substrate. At least one of the plurality of bit line contacts is disposed within one of the trenches defined by the substrate. The plurality of trenches has a first row and a second row, and a pitch of the first row is different from a pitch of the second row.

The embodiments of the present disclosure illustrate a semiconductor device with bit line contacts. In this embodiment, the outmost row bit line contact can have an integral profile. In this embodiment, the isolation spacer abutting the bit line contact can have an integral profile, thereby preventing an electrical short between the bit line and the capacitor contact or the moat.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures, and:

DETAILED DESCRIPTION

Figure 1A:
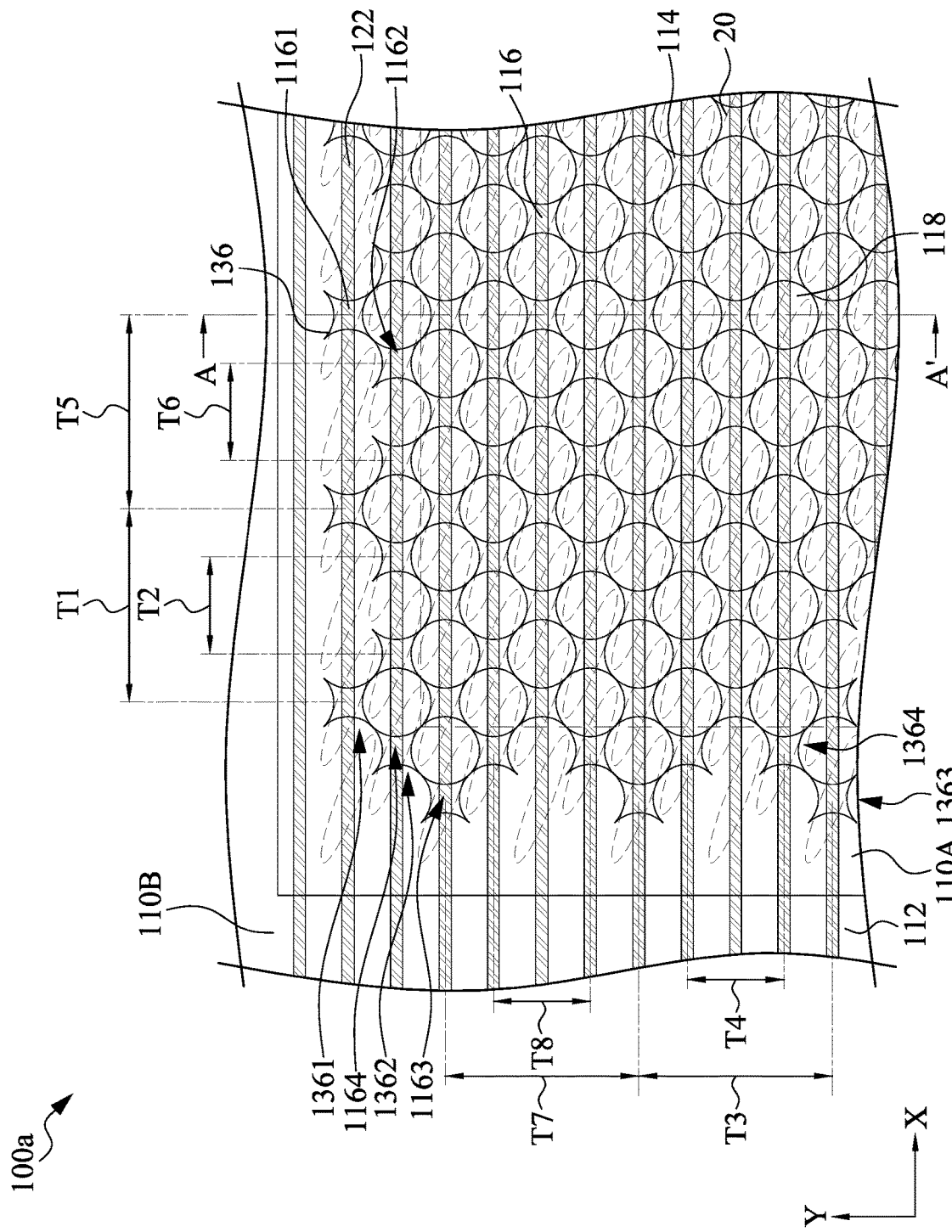
FIG. 1A is a top view of a semiconductor device, in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc., may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

Figure 1B:
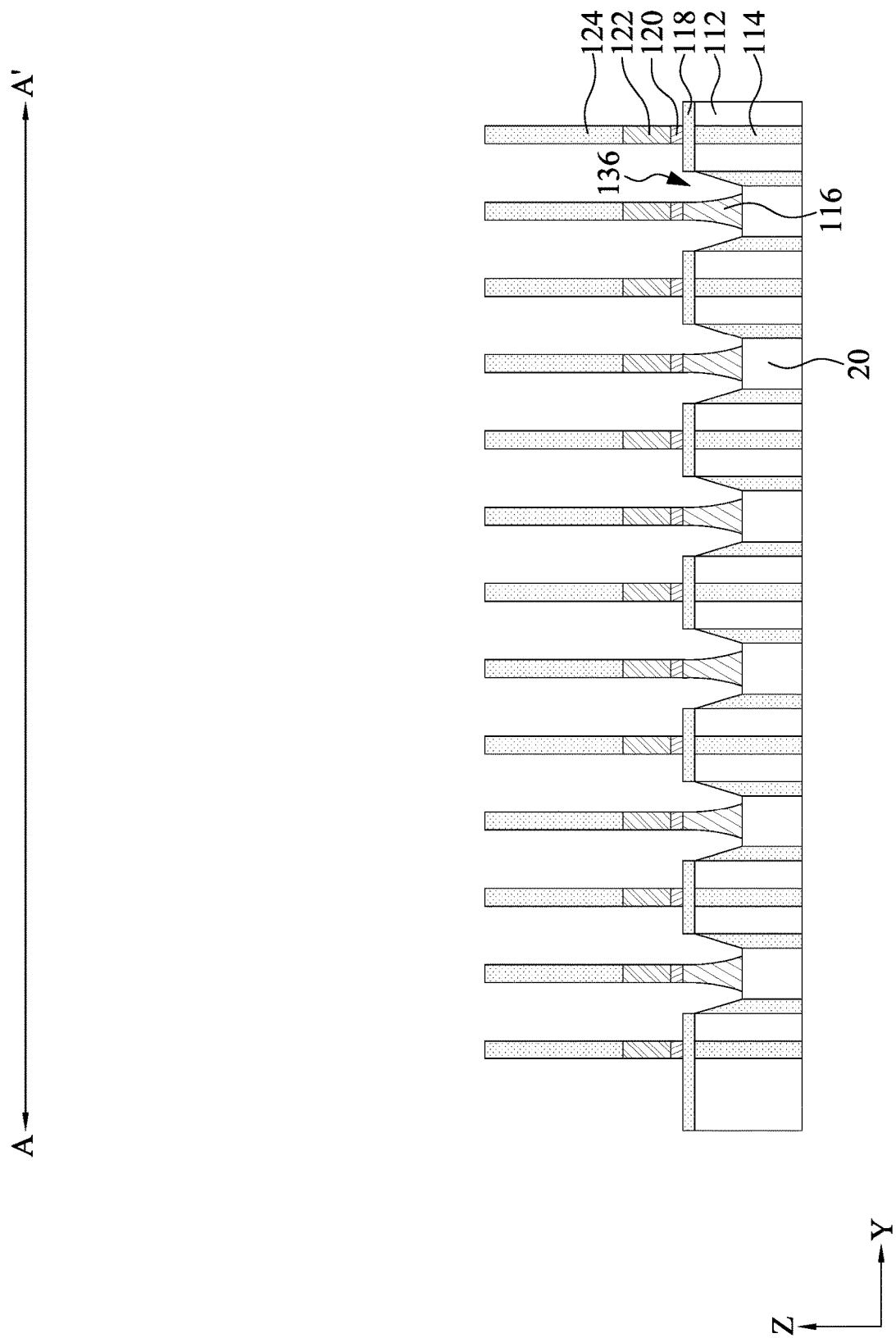
FIG. 1B is a cross-sectional view along line A-A' of the semiconductor device as shown in FIG. 1A, in accordance with some embodiments of the present disclosure.

Referring to FIG. 1A and FIG. 1B, FIG. 1A is a top view of a semiconductor device 100a, in accordance with some embodiments of the present disclosure, and FIG. 1B is a cross-sectional view along line A-A' of the semiconductor device 100a as shown in FIG. 1A, in accordance with some embodiments of the present disclosure. It should be noted that some elements are omitted from FIG. 1B for brevity.

In some embodiments, the semiconductor device 100a can include a cell region 110A and a peripheral region 110B.

In some embodiments, the cell region 110A can be a region in which a memory device is formed. The memory device can include, for example, a dynamic random access memory (DRAM) device, a one-time programming (OTP) memory device, a static random access memory (SRAM) device, or other suitable memory devices. In some embodiments, a DRAM can include, for example, a transistor, a capacitor, and other components. During a read operation, a word line can be asserted, turning on the transistor. The enabled transistor allows the voltage across the capacitor to be read by a sense amplifier through a bit line. During a write operation, the data to be written can be provided on the bit line when the word line is asserted.

The peripheral region 110B can be a region utilized to form a logic device (e.g., system-on-a-chip (SoC), central processing unit (CPU), graphics processing unit (GPU), application processor (AP), microcontroller, etc.), a radio frequency (RF) device, a sensor device, a micro-electro-mechanical-system (MEMS) device, a signal processing device (e.g., digital signal processing (DSP) device)), a front-end device (e.g., analog front-end (AFE) devices) or other devices.

The semiconductor device 100a can include a substrate 112. The substrate 112 may be a semiconductor substrate, such as a bulk semiconductor, a semiconductor-on-insulator (SOI) substrate, or the like. The substrate 112 can include an elementary semiconductor including silicon or germanium in a single crystal form, a polycrystalline form, or an amorphous form; a compound semiconductor material including at least one of silicon carbide, gallium arsenide, gallium phosphide, indium phosphide, indium arsenide, and indium antimonide; an alloy semiconductor material including at least one of SiGe, GaAsP, AlInAs, AlGaAs, GaInAs, GaInP, and GaInAsP; any other suitable materials; or a combination thereof. In some embodiments, the alloy semiconductor substrate may be a SiGe alloy with a gradient Ge feature in which the Si and Ge composition changes from one ratio at one location to another ratio at another location of the gradient SiGe feature. In another embodiment, the SiGe alloy is formed over a silicon substrate. In some embodiments, a SiGe alloy can be mechanically strained by another material in contact with the SiGe alloy. In some embodiments, the substrate 112 may have a multilayered structure, or the substrate 112 may include a multilayered compound semiconductor structure.

In some embodiments, the substrate 112 can include a plurality of active areas 20. The active area 20 can function as, for example, a channel for electrical connection. In some embodiments, the active areas 20 can be located within the cell region 100A of the semiconductor device 100a.

In some embodiments, the semiconductor device 100a can include an isolation structure 114. In some embodiments, the plurality of active areas 20 can be separated by the isolation structures 114. In some embodiments, the isolation structure 114 can be embedded in the substrate 112. In some embodiments, the isolation structure 114 can include, for example, silicon oxide ($SiO_2$), silicon nitride ($Si_3N_4$), silicon oxynitride ($N_2OSi_2$), silicon nitride oxide ($N_2OSi_2$), or other suitable materials.

In some embodiments, the semiconductor device 100a can include bit line contacts 116. In some embodiments, at least one of the bit line contacts 116 can be disposed on the active area 20 of the substrate 112. The bit line contact 116 can include metal, such as W, Cu, Ru, Ir, Ni, Os, Rh, Al, Mo, Co, alloys thereof, combinations thereof or any metallic material with suitable resistance and gap-fill capability. In some embodiments, at least one of the bit line contacts 116 can be disposed within a trench 136 recessed from a top surface of the substrate 112.

In some embodiments, the semiconductor device 100a can include a dielectric layer 118. The dielectric layer 118 can be disposed on the substrate 112. In some embodiments, the dielectric layer 118 can cover a portion of the isolation structure 114. In some embodiments, the dielectric layer 118 can be utilized to define the trench 136. In some embodiments, the dielectric layer 118 can include, for example, silicon oxide ($SiO_2$), silicon nitride ($Si_3N_4$), silicon oxynitride ($N_2OSi_2$), silicon nitride oxide ($N_2OSi_2$), a high-k material or combinations thereof. Examples of the high-k material include a dielectric material having a dielectric constant that is higher than that of silicon dioxide ($SiO_2$), or a dielectric material having a dielectric constant higher than about 3.9. In some embodiments, the dielectric layer 118 can include at least one metallic element, such as hafnium oxide ($HfO_2$), silicon doped hafnium oxide (HSO), lanthanum oxide ($La_2O_3$), lanthanum aluminum oxide ($LaAlO_3$), zirconium oxide ($ZrO_2$), zirconium orthosilicate ($ZrSiO_4$), aluminum oxide ($Al_2O_3$) or combinations thereof.

In some embodiments, at least one of the active areas 20 can have a part free from vertically overlapping the dielectric layer 118 from a top view.

In some embodiments, the semiconductor device 100a can include bit line stacks 120. In some embodiments, at least one of the bit line stacks 120 can extend along the X-direction. In some embodiments, a portion of the bit line stacks 120 can be disposed on the bit line contact 116. In some embodiments, a portion of the bit line stacks 120 can be in contact with the bit line contact 116. In some embodiments, a portion of the bit line stacks 120 can be electrically connected to the bit line contact 116. In some embodiments, a portion of the bit line stacks 120 can be disposed on the dielectric layer 118. In some embodiments, a portion of the bit line stacks 120 can be in contact with the dielectric layer 118. In some embodiments, a portion of the bit line stacks 120 can be electrically isolated from the bit line contact 116. The bit line stack 120 can include titanium, tantalum, titanium nitride, tantalum nitride, manganese nitride or a combination thereof.

In some embodiments, the semiconductor device 100a can include bit lines 122. In some embodiments, at least one of the bit lines 122 can extend along an X-direction. In some embodiments, at least one of the bit lines 122 can be disposed on the bit line stack 120. In some embodiments, a portion of the bit lines 122 can be disposed on the bit line contact 116. In some embodiments, a portion of the bit lines 122 can be electrically connected to the bit line contact 116. In some embodiments, a portion of the bit lines 122 can be disposed on the dielectric layer 118. In some embodiments, a portion of the bit lines 122 can be electrically isolated from the bit line contact 116. The bit line 122 can include metal, such as W, Cu, Ru, Ir, Ni, Os, Rh, Al, Mo, Co, alloys thereof, or combinations thereof.

In some embodiments, the semiconductor device 100a can include dielectric layers 124. In some embodiments, at least one of the dielectric layers 124 can extend along the X-direction. In some embodiments, at least one of the dielectric layers 124 can be disposed on the bit line 122. In some embodiments, the dielectric layer 124 can include, for example, silicon oxide ($SiO_2$), silicon nitride ($Si_3N_4$), silicon oxynitride ($N_2OSi_2$), silicon nitride oxide ($N_2OSi_2$), a high-k material or combinations thereof. Examples of the high-k material include a dielectric material having a dielectric constant exceeding that of silicon dioxide ($SiO_2$), or a dielectric material having a dielectric constant exceeding about 3.9. In some embodiments, the dielectric layer 124 can include at least one metallic element, such as hafnium oxide ($HfO_2$), silicon doped hafnium oxide (HSO), lanthanum oxide ($La_2O_3$), lanthanum aluminum oxide ($LaAlO_3$), zirconium oxide ($ZrO_2$), zirconium orthosilicate ($ZrSiO_4$), aluminum oxide ($Al_2O_3$) or combinations thereof.

In some embodiments, the semiconductor device 100a can further include word lines (not shown). At least one of the word lines can extend along the Y-direction. The word line can be substantially perpendicular to the bit line 122.

As shown in FIG. 1B, the trench 136 can be recessed from the top surface of the substrate 112. In some embodiments, a portion of the isolation structure 114 can be exposed from the trench 136. In some embodiments, the trench 136 can be surrounded by the dielectric layer 118. Although FIG. 1A illustrates that the trench 136 has a boundary concave with respect to the dielectric layer 118, the trench 136 can have other profiles, such as circular, elliptical, or other suitable profiles in other embodiments.

As shown in FIG. 1A, the trenches 136 can have a row 1361 and a row 1362. In some embodiments, a pitch T1 of the row 1361 of the trenches 136 can be different from a pitch T2 of the row 1362 of the trenches 136. In some embodiments, the pitch T1 of the row 1361 of the trenches 136 can exceed the pitch T2 of the row 1362 of the trenches 136. In some embodiments, the pitch T1 can be substantially twice the pitch T2. In some embodiments, the row 1361 of the trenches 136 can be the outmost row. In some embodiments, the row 1361 of the trenches 136 can be the topmost (or bottom most) row from a top view within one cell region 110A.

In some embodiments, the trenches 136 can have a column 1363 and a column 1364. In some embodiments, a pitch T3 of the column 1363 of the trenches 136 can be different from a pitch T4 of the column 1364 of the trenches 136. In some embodiments, the pitch T3 of the column 1363 of the trenches 136 can exceed the pitch T4 of the column 1364 of the trenches 136. In some embodiments, the pitch T3 can be substantially twice the pitch T4. In some embodiments, the column 1363 of the trenches 136 can be the outmost column. In some embodiments, the column 1363 of the trenches 136 can be the leftmost (or rightmost) column from a top view within one cell region 110A.

As shown in FIG. 1A, the bit line contacts 116 can have a row 1161 and a row 1162. In some embodiments, a pitch T5 of the row 1161 of the bit line contacts 116 can be different from a pitch T6 of the row 1162 of the bit line contacts 116. In some embodiments, the pitch T5 of the row 1161 of the bit line contacts 116 can exceed the pitch T6 of the row 1162 of the bit line contacts 116. In some embodiments, the pitch T5 can be substantially twice the pitch T6. In some embodiments, the row 1161 of the bit line contacts 116 can be the outmost row. In some embodiments, the row 1161 of the bit line contacts 116 can be the topmost (or bottom most) row from a top view within one cell region 110A.

In some embodiments, the bit line contacts 116 can have a column 1163 and a column 1164. In some embodiments, a pitch T7 of the column 1163 of the bit line contacts 116 can be different from a pitch T8 of the column 1164 of the bit line contacts 116. In some embodiments, the pitch T7 of the column 1163 of the bit line contacts 116 can exceed the pitch T8 of the column 1164 of the bit line contacts 116. In some embodiments, the pitch T7 can be substantially twice the pitch T8. In some embodiments, the column 1163 of the bit line contacts 116 can be the outmost column. In some embodiments, the column 1163 of the bit line contacts 116 can be the leftmost (or rightmost) column from a top view within one cell region 110A.

In this embodiment, the trench 136 in the outmost row (or column) can have an integral profile the same as an inner row. For example, the profile of the trench 136 in the row 1361 can be substantially the same as that of the row 1362. In this embodiment, the pitch of the trenches 136 in the outmost row (e.g., 1361) is different from the pitch of the trenches 136 in an inner row (e.g., 1362) of the trenches 136. In a comparative semiconductor device, the trench in the outmost row (or column) may have merely a half profile compared to one in an inner row. As a result, a sidewall of the bit line contact in the outmost row (or column) may be free of an isolation spacer, resulting in electrical leakage between a bit line and a capacitor contact. In this embodiment, since the trench 136 in the outmost row (or column) has an integral profile, isolation spacers can be formed on both two sides of the bit line contact, thereby preventing an electrical short between the bit line 122 and the capacitor contact.

Figure 2:
FIG. 2 is a flowchart illustrating a method of manufacturing a semiconductor device, in accordance with some embodiments of the present disclosure.

FIG. 2 is a flowchart illustrating a method 200 of manufacturing a semiconductor device, in accordance with some embodiments of the present disclosure.

The method 200 begins with operation 202 in which a substrate is provided. The substrate can include a plurality of active areas. The plurality of active areas can be separated by an isolation structure. A first dielectric layer can be formed on the substrate. The first dielectric layer can cover the active area and the isolation structures.

The method 200 continues with operation 204 in which first mask structures can be formed. The first mask structures can be staggered. The first mask structures can have a first row, a second row, and a third row. The second row can be disposed between the first row and the third row. At least one of the first mask structures in the first row can be aligned with a corresponding structure in the third row. The first mask structures in the first row and the second mask structures in the second row can be staggered. At least one of the active areas can have a first part free from vertically overlapping the first mask structures. The first part of the active area can be surrounded by the first mask structures from a top view. At least one of the active areas can have a second part vertically overlapping the first mask structures. At least one of the active areas can vertically overlap two of the first mask structures.

The method 200 continues with operation 206 in which a first protective layer can be formed. The first protective layer can be utilized to define a first region to be etched by a subsequent first etching. The first protective layer can cover a portion of the first mask structures. The first protective layer can include a photosensitive material. A portion of the first mask structures can be partially covered by the first protective layer. The portion of the first mask structures can be partially exposed by the first mask structures. The first protective layer can cover a portion of the substrate. The first protective layer can have a zigzag edge from a top view. The edge of the first protective layer can be free from intersecting the first part of the active area.

The first protective layer can have a first side extending along a first direction and a second side extending along a second direction different from the first. The first direction can be slanted with respect to the X-direction. The first direction can be slanted with respect to the Y-direction. The second direction can be slanted with respect to the X-direction. The second direction can be slanted with respect to the Y-direction. The first side of the first protective layer can be substantially perpendicular to the second side of the first protective layer. The first side of the first protective layer can be free from intersecting the first part of the active area. The second side of the first protective layer can be free from intersecting the first part of the active area. The first side of the first protective layer can be across two or more first mask structures of different rows. The second side of the first protective layer can be across two or more first mask structures of different rows.

Further, the semiconductor device can include a plurality of word lines embedded in the substrate. At least one of the word lines can be substantially parallel to the Y-direction. The first side of the first protective layer can be slanted with respect to the word line from a top view. The second side of the first protective layer can be slanted with respect to the word line from a top view.

The method 200 continues with operation 208 in which a first etching process is performed. The first dielectric layer exposed by the first protective layer and exposed by the first mask structures can be removed. The substrate exposed by the first protective layer and exposed by the first mask structures can be removed.

A portion of the isolation structure can be removed. A portion of the active areas can be removed. A portion of the first dielectric layer can remain on the substrate. A plurality of trenches can be formed. A plurality of trenches can be formed by the first etching processes. The trenches can be recessed from the substrate. The trenches can be recessed from the first dielectric layer. At least one of the trenches can be defined by the first dielectric layer, the substrate, and the isolation structure.

The first mask structures can be removed after the first etching process. The first protective layer can be removed after the first etching process. A portion of the first dielectric layer can be removed by a chemical mechanical polishing process.

The trenches can have a first row and a second row. A pitch of the first row of the trenches can be different from a pitch of the second row of the trenches. The pitch of the first row of the trenches can exceed the pitch of the second row of the trenches. The first row of the trenches can be the outmost row. The pitch of the first row of the trenches can be substantially twice the pitch of the second row of the trenches. The first row of the trenches can be the topmost (or bottom most) row from a top view.

The trenches can have a first column and a second column. A pitch of the first column of the trenches can be different from a pitch of the second column of the trenches. The pitch of the first column of the trenches can exceed the pitch of the second column of the trenches. The pitch of the first column of the trenches can be substantially twice the pitch of the second column of the trenches. The first column of the trenches can be the outmost column. The first column of the trenches can be the leftmost (or rightmost) column from a top view.

The method 200 continues with operation 210 in which a conductive layer can be formed. The conductive layer can fill the trenches. The conductive layer can be surrounded by the first dielectric layer.

The method 200 continues with operation 212 in which a barrier layer, a metallization layer, and a second dielectric layer are formed. The barrier layer can cover the substrate. The barrier layer can cover the first dielectric layer. The metallization layer can be configured to form bit lines. The metallization layer can cover the barrier layer. The second dielectric layer can cover the metallization layer.

The method 200 continues with operation 214 in which second mask structures and a pitch adjustment structure are formed. The second mask structures can cover the second dielectric layer. A portion of the metallization layer can be exposed from the second mask structures. A portion of the barrier layer can be exposed from the second mask structures. A portion of the second dielectric layer can be exposed from the second mask structures. A portion of the conductive layer can be free from vertically overlapping the second mask structures.

The pitch adjustment structure can be conformally formed on the second mask structures. The pitch adjustment structure can be utilized to reduce the aperture defined by the second mask structures. A portion of the pitch adjustment structure can be disposed between the openings defined by the second mask structures.

The method 200 continues with operation 216 in which a second protective layer can be formed. The second protective layer can be utilized to define a second region to be etched by a second etching process subsequently performed. The second region can be rectangular or square. A portion of the substrate can be exposed by the second protective layer. A portion of the second masks structures can be exposed by the second protective layer. A portion of the pitch adjustment structure can be exposed by the second protective layer.

The second protective layer can include a first side and a second side substantially perpendicular to the first side. The first side of the first protective layer can be slanted with respect to the first side of the second protective layer. The first side of the first protective layer can be slanted with respect to the second side of the second protective layer. The second side of the first protective layer can be slanted with respect to the first side of the second protective layer. The second side of the first protective layer can be slanted with respect to the second side of the second protective layer.

The method 200 continues with operation 218 in which a second etching process is performed. The second dielectric layer exposed by the second protective layer and exposed by the second mask structures can be removed. The metallization layer exposed by the second protective layer and exposed by the second mask structures can be removed, thereby forming bit lines extending along the X-direction. The barrier layer exposed by the second protective layer and by the second mask structures can be removed, thereby forming bit line stacks extending along the X-direction.

The second protective layer can be removed after the second etching process. The second mask structures can be removed after the second etching process. The pitch adjustment layer can be removed after the second etching process. A portion of the conductive layer can be exposed by the bit line stacks. The portion of the conductive layer can be exposed by the bit lines. The portion of the conductive layer can be exposed by the second conductive layer. A portion of the bit lines can be disposed over the conductive layer. A portion of the bit lines can be disposed over the first conductive layer. A portion of the bit lines can be disposed over the isolation structure.

The method 200 continues with operation 220 in which a portion of the conductive layer is removed, thereby producing a semiconductor device.

In some embodiments, the portion of the conductive layer exposed by the bit lines can be removed, thereby forming bit line contacts. At least one of the bit line contacts can be formed within the trench defined by the substrate. At least one of the bit line contacts can be connected by the bit line. In some embodiments, the bit line contacts can have a first row and a second row. In some embodiments, the first row of the bit line contacts can be connected by a first bit line. In some embodiments, the second row of the bit line contacts can be connected by a second bit line. A pitch of the first row of the bit line contacts can be different from a pitch of the second row of the bit line contacts. In some embodiments, the pitch of the first row of the bit line contacts can exceed the pitch of the second row of the bit line contacts. The pitch of the first row of the bit line contacts can be substantially twice the pitch of the second row of the bit line contacts. In some embodiments, the first row of the bit line contacts can be the outmost row. In some embodiments, the first row of the bit line contacts can be the topmost (or bottom most) row from a top view within one cell region of the semiconductor device.

In some embodiments, the bit line contacts can have a first column and a second column. A pitch of the first column of the bit line contacts can be different from a pitch of the second column of the bit line contacts. In some embodiments, the pitch of the first column of the bit line contacts can exceed the pitch of the second column of the bit line contacts. The pitch of the first column of the bit line contacts can be substantially twice the pitch of the second column of the bit line contacts. In some embodiments, the first column of the bit line contacts can be the outmost column. In some embodiments, the first column of the bit line contacts can be the leftmost (or rightmost) column from a top view within one cell region of the semiconductor device.

In this embodiment, the first protective layer with a specific profile, such as a zigzag shape, is utilized to define a region on which an etching is performed. By using the aforesaid first protective layer, the trench in the outmost row (or column) can have an integral profile in comparison with an inner one, thereby preventing an electrical short between the bit line and the capacitor contact.

The method 200 is merely an example, and is not intended to limit the present disclosure beyond what is explicitly recited in the claims. Additional operations can be provided before, during, or after each operations of the method 200, and some operations described can be replaced, eliminated, or reordered for additional embodiments of the method. In some embodiments, the method 200 can include further operations not depicted in FIG. 2. In some embodiments, the method 200 can include one or more operations depicted in FIG. 2.

FIG. 3A, FIG. 4A, FIG. 5A, FIG. 6A, FIG. 7A, FIG. 8A, FIG. 9A, FIG. 10A, FIG. 11A, and FIG. 12A illustrate one or more stages of an exemplary method for manufacturing a semiconductor device according to some embodiments of the present disclosure, and FIG. 3B, FIG. 4B, FIG. 5B, FIG. 6B, FIG. 7B, FIG. 8B, FIG. 9B, FIG. 10B, FIG. 11B and FIG. 12B are cross-sectional views along line A-A' of FIG. 3A, FIG. 4A, FIG. 5A, FIG. 6A, FIG. 7A, FIG. 8A, FIG. 9A, FIG. 10A, FIG. 11A, and FIG. 12A respectively. It should be noted that some elements are omitted from FIG. 3A, FIG. 4A, FIG. 5A, FIG. 6A, FIG. 7A, FIG. 8A, FIG. 9A, FIG. 10A, FIG. 11A, and FIG. 12A for brevity.

Figure 3A:
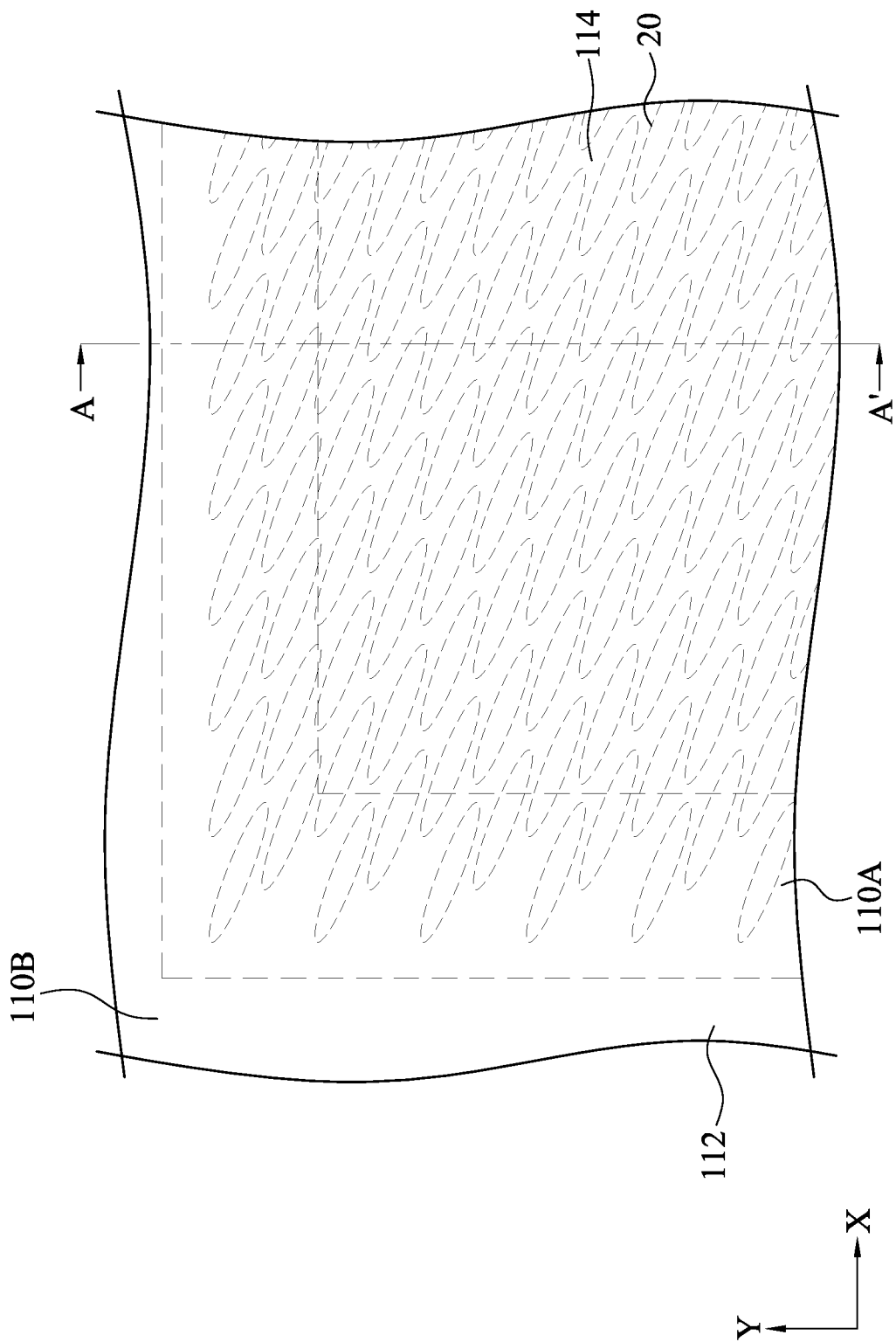
FIG. 3A illustrates one or more stages of an example of a method for manufacturing a semiconductor device according to some embodiments of the present disclosure.
Figure 3B:
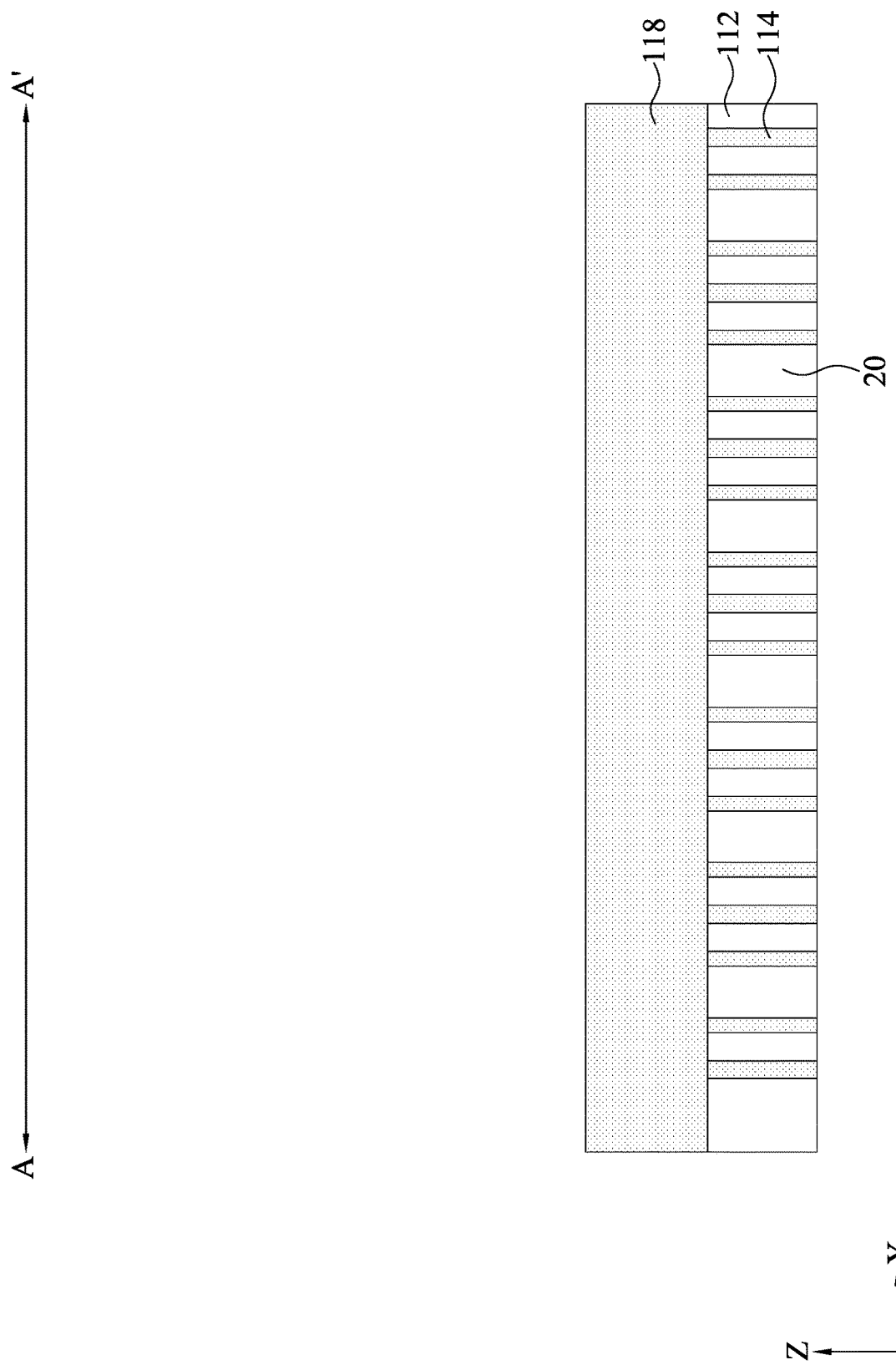
FIG. 3B is a cross-sectional view along line A-A' of FIG. 3A, according to some embodiments of the present disclosure.

Referring to FIG. 3A and FIG. 3B, a substrate 112 is provided. In some embodiments, the substrate 112 can include a plurality of active areas 20. In some embodiments, the plurality of active areas 20 can be separated by an isolation structures 114. A dielectric layer 118 can be formed on the substrate 112. In some embodiments, the substrate 112 can cover the active area 20 and the isolation structures 114. In some embodiments, a plurality of word lines (not shown) can be formed within the substrate 112. At least one of the word lines can extend along the Y-direction. In some embodiments, the word line is slanted with respect to a long axis of at least one of the active area 20. The semiconductor device can include a cell region 110A and a peripheral region 110B.

Figure 4A:
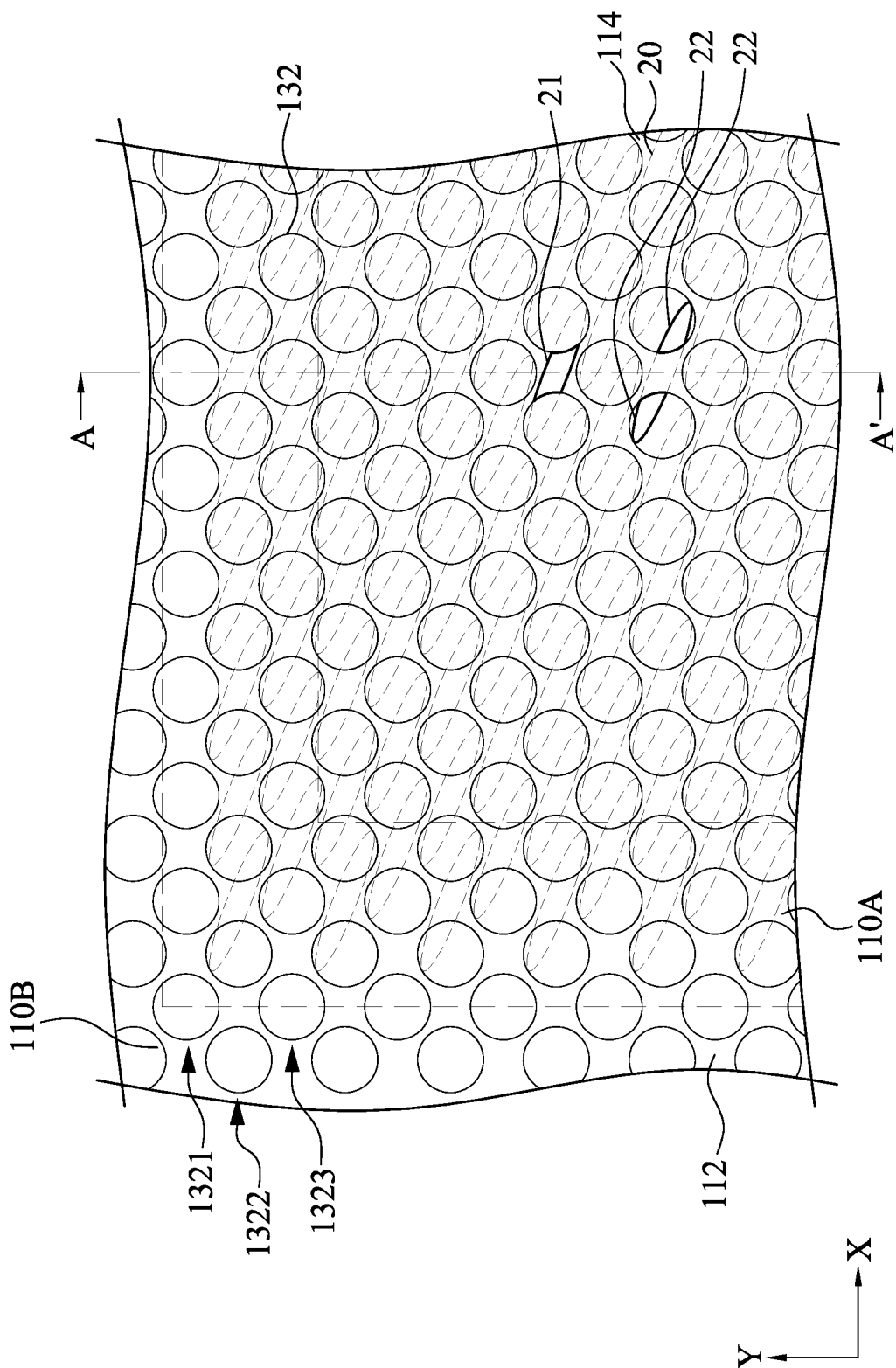
FIG. 4A illustrates one or more stages of an example of a method for manufacturing a semiconductor device according to some embodiments of the present disclosure.
Figure 4B:
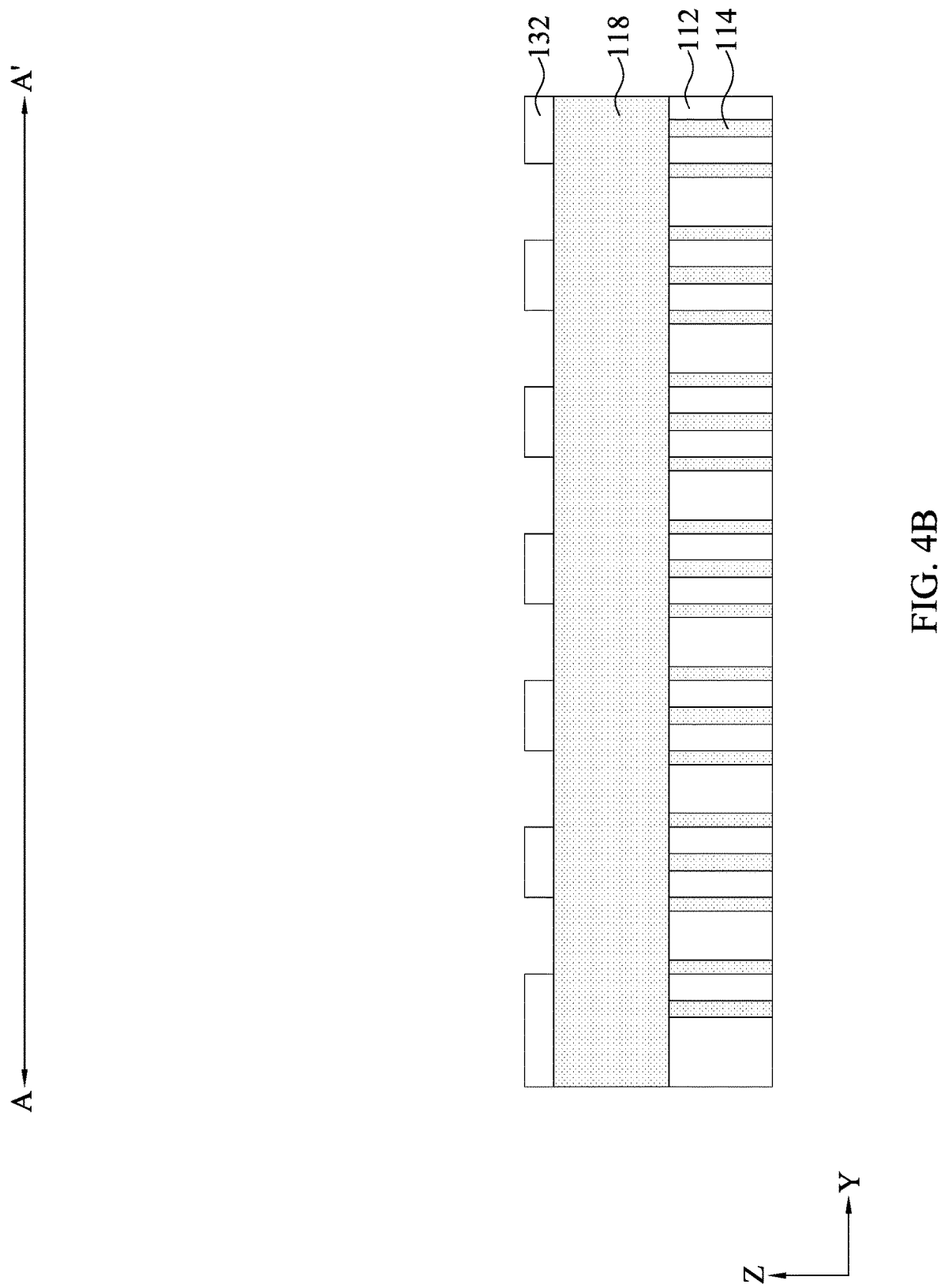
FIG. 4B is a cross-sectional view along line A-A' of FIG. 4A, according to some embodiments of the present disclosure.

Referring to FIG. 4A and FIG. 4B, mask structures 132 can be formed. In some embodiments, the mask structures can be formed by chemical vapor deposition (CVD), atomic layer deposition (ALD), physical vapor deposition (PVD), low-pressure chemical vapor deposition (LPCVD), or other suitable processes. In some embodiments, the mask structures 132 can be circular or other suitable shapes from a top view.

In some embodiments, the mask structures 132 can be staggered. In some embodiments, the mask structures 132 can have rows 1321, 1322, and 1323. The row 1322 can be disposed between the rows 1321 and 1323. At least one of the mask structures 132 in the row 1321 can be align with a corresponding structure in the row 1323. In some embodiments, the mask structures 132 in the row 1321 and the mask structures 132 in the row 1322 can be staggered.

At least one of the active areas 20 can have a part 21 free from vertically overlapping the mask structures 132. In some embodiments, the part 21 of the active area 20 can be surrounded by the mask structures 132 from a top view. At least one of the active areas 20 can have a part 22 vertically overlapping the mask structures 132. At least one of the active areas 20 can vertically overlap two or more of the mask structures 132.

Figure 5A:
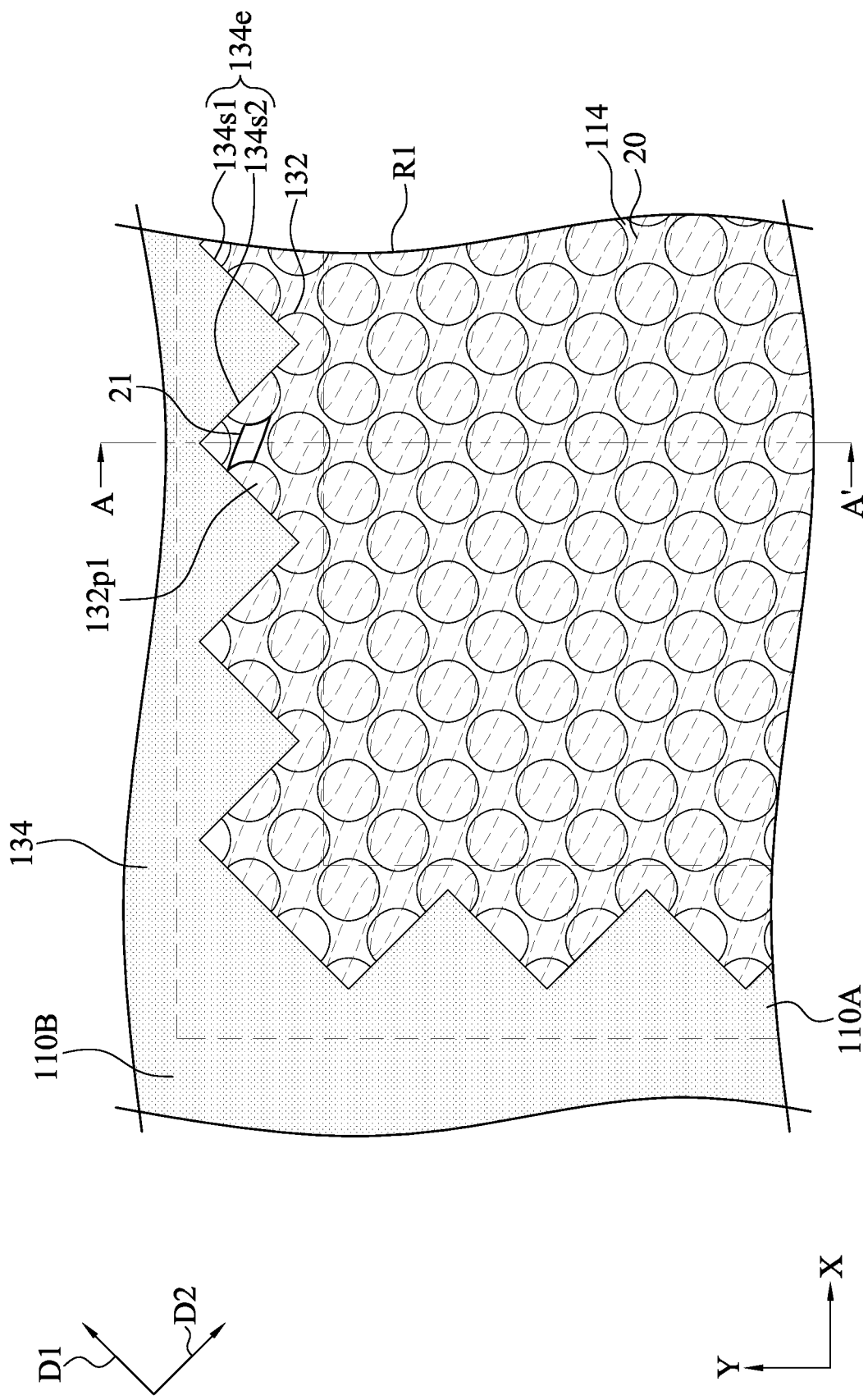
FIG. 5A illustrates one or more stages of an example of a method for manufacturing a semiconductor device according to some embodiments of the present disclosure.
Figure 5B:
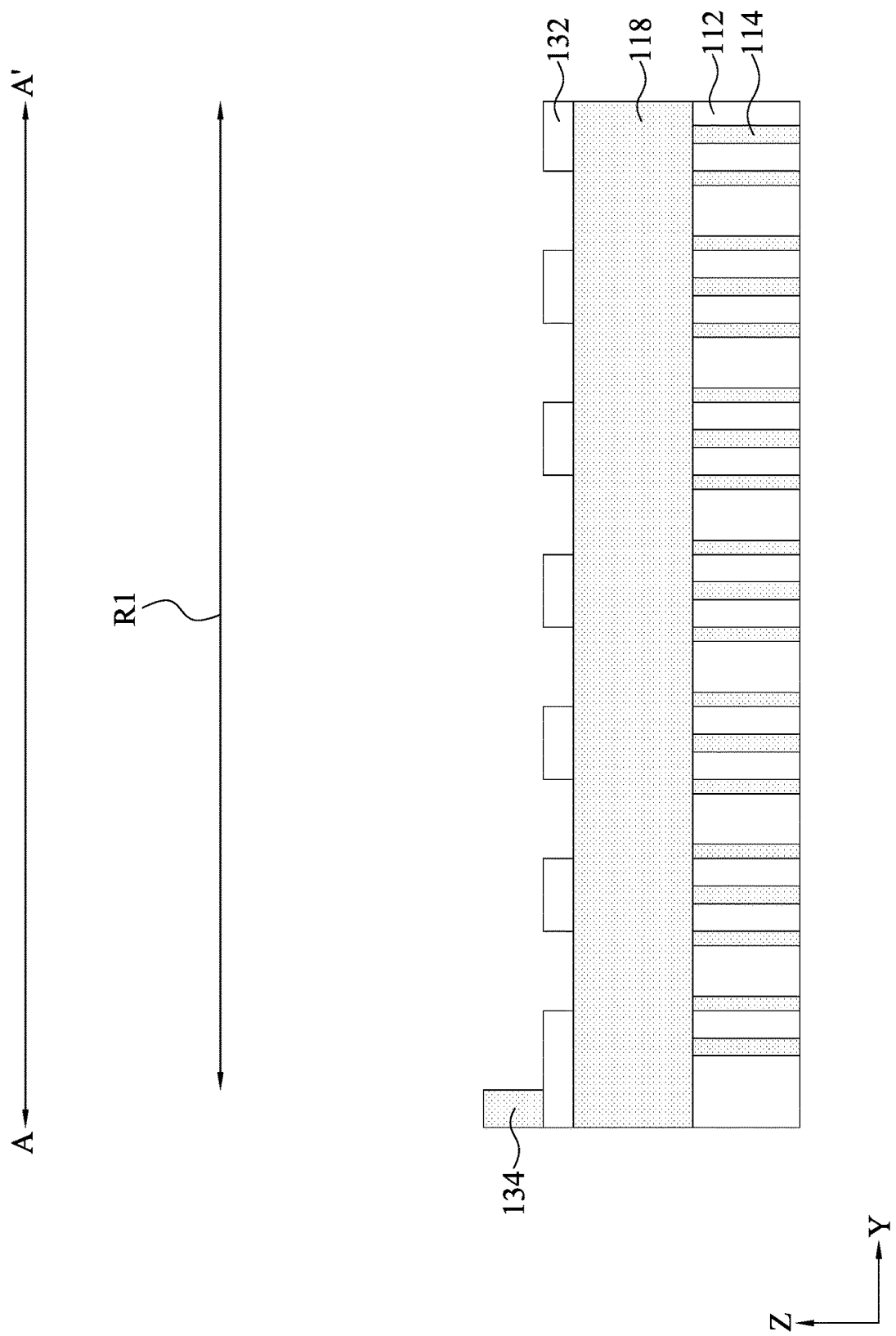
FIG. 5B is a cross-sectional view along line A-A' of FIG. 5A, according to some embodiments of the present disclosure.

Referring to FIG. 5A and FIG. 5B, a protective layer 134 can be formed. In some embodiments, the protective layer 134 can be utilized to define a region R1 to be etched subsequently. In some embodiments, the protective layer 134 can cover a portion of the mask structures 132. In some embodiments, the protective layer 134 can include a photosensitive material.

In some embodiments, a portion 132p1 of the mask structures 132 can be partially covered by the mask structures 132. In some embodiments, the portion 132p1 of the mask structures 132 can be partially exposed by the protective layer 134. In some embodiments, the protective layer 134 can cover a portion of the substrate 112.

In some embodiments, the protective layer 134 can have an edge 134e. In some embodiments, the edge 134e can have a zigzag shape from a top view. In some embodiments, the edge 134e of the protective layer 134 can be free from intersecting the part 21 of the active area 20 from a top view.

In some embodiments, the protective layer 134 can have a side 134s1 extending a long a direction D1 and a side 134s2 extending along a direction D2 different from the direction D1. In some embodiments, the direction D1 can be slanted with respect to the X-direction. In some embodiments, the direction D1 can be slanted with respect to the Y-direction. In some embodiments, the direction D2 can be slanted with respect to the X-direction. In some embodiments, the direction D2 can be slanted with respect to the Y-direction. In some embodiments, word lines (not shown) are formed in the substrate 112. The word line can extend along the Y-direction. In some embodiments, the side 134s1 of the protective layer 134 can be slanted with respect to the word line. In some embodiments, the side 134s2 of the protective layer 134 can be slanted with respect to the word line.

In some embodiments, the side 134s1 of the protective layer 134 can be substantially perpendicular to the side 134s2 of the protective layer 134. In some embodiments, the side 134s1 of the protective layer 134 can be free from intersecting the part 21 of the active area 20 from a top view. In some embodiments, the side 134s2 of the protective layer 134 can be free from intersecting the part 21 of the active area 20 from a top view. In some embodiments, the side 134s1 of the protective layer 134 can be across two or more mask structures 132 of different rows from a top view. In some embodiments, the side 134s2 of the protective layer 134 can be across two or more mask structures 132 of different rows from a top view.

Figure 6A:
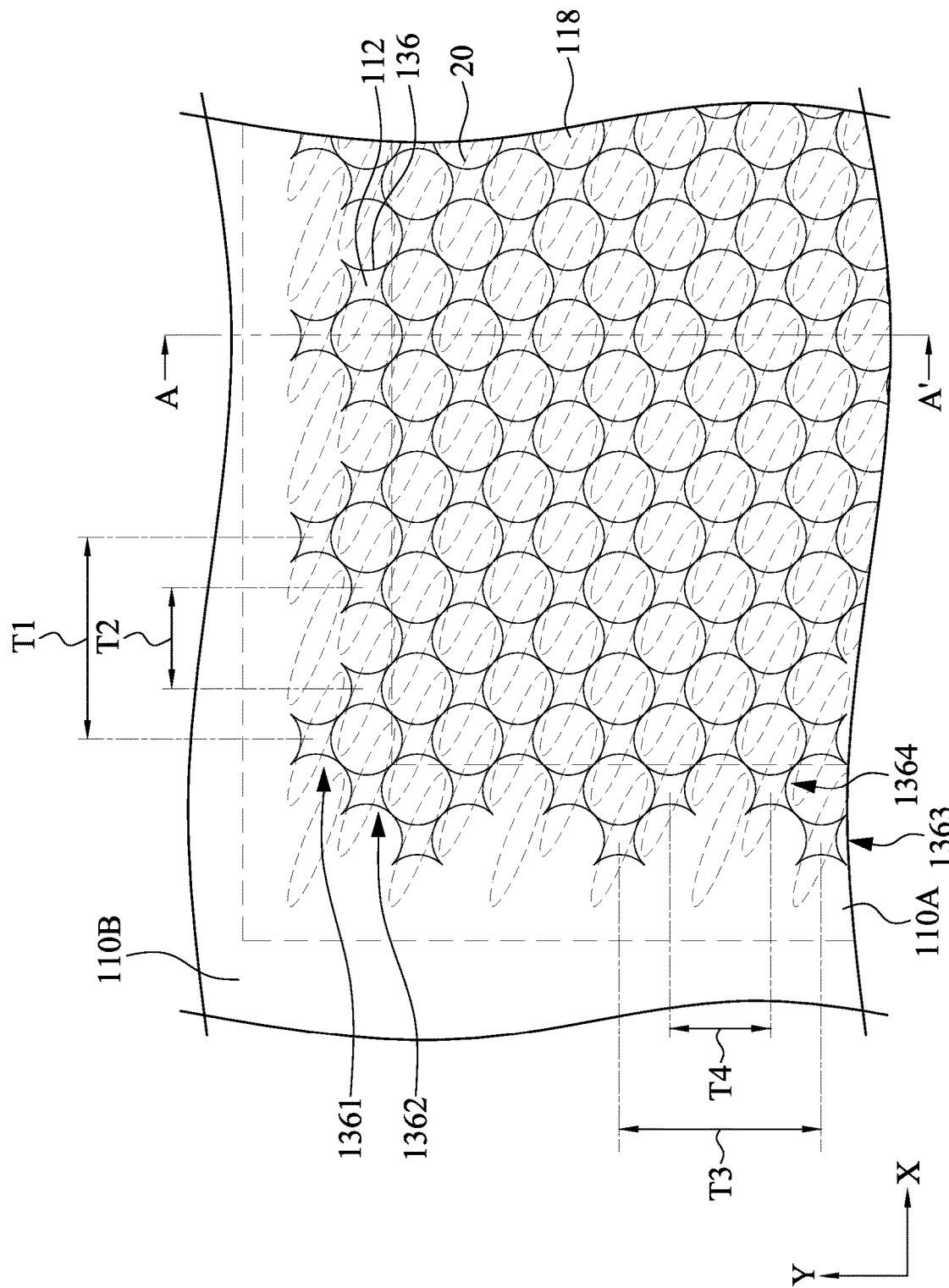
FIG. 6A illustrates one or more stages of an example of a method for manufacturing a semiconductor device according to some embodiments of the present disclosure.
Figure 6B:
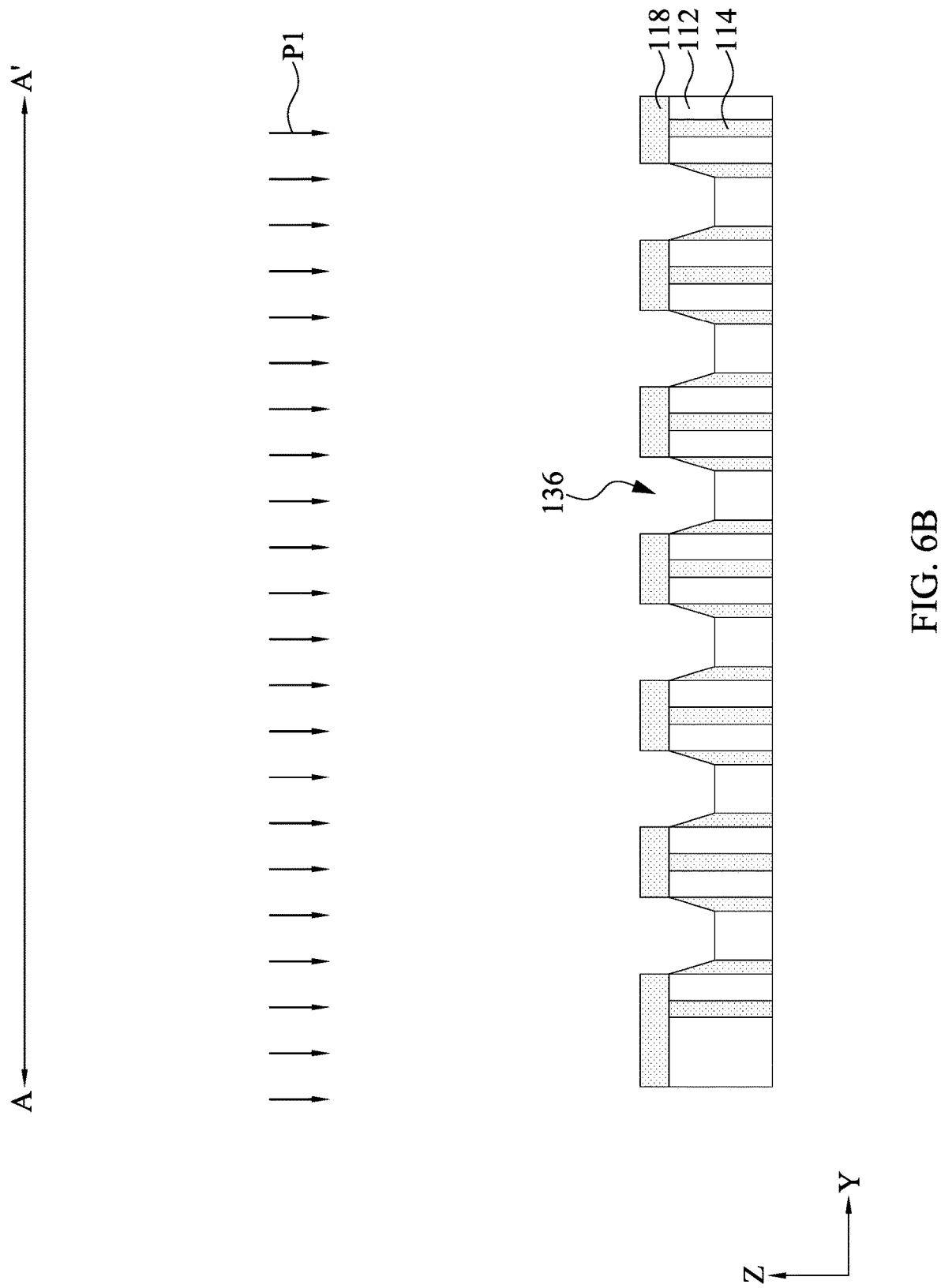
FIG. 6B is a cross-sectional view along line A-A' of FIG. 6A, according to some embodiments of the present disclosure.

Referring to FIG. 6A and FIG. 6B, an etching process P1 is performed. The etching process P1 can include a dry etching, a wet etching, or other suitable processes. In some embodiments, the dielectric layer 118 exposed by the protective layer 134 and exposed by the mask structures 132 can be removed. In some embodiments, the substrate 112 exposed by the protective layer 134 and exposed by the mask structures 132 can be removed. In some embodiments, a portion of the isolation structures 114 can be removed.

In some embodiments, a portion of the active areas 20 can be removed. In some embodiments, a portion of the dielectric layer 118 can remain on the substrate 112.

In some embodiments, a plurality of trenches 136 can be formed. In some embodiments, the plurality of trenches 136 can be formed by the etching process P1. In some embodiments, the trenches 136 can be recessed from the substrate 112. In some embodiments, the trenches 136 can be recessed from the dielectric layer 118. At least one of the trenches 136 can be defined by the dielectric layer 118, the substrate 112, and the isolation structures 114.

In some embodiments, the mask structures 132 can be removed after the etching process P1. In some embodiments, the protective layer 134 can be removed after the etching process P1. In some embodiments, a portion of the dielectric layer 118 can be removed by a chemical mechanical polishing process.

In some embodiments, the trenches 136 can have rows 1361 and 1362. In some embodiments, a pitch T1 of the row 1361 of the trenches 136 can be different from a pitch T2 of the row 1362 of the trenches 136. In some embodiments, the pitch T1 of the row 1361 of the trenches 136 can exceed the pitch T2 of the row 1362 of the trenches 136. In some embodiments, the pitch T1 can be substantially twice the pitch T2. In some embodiments, the row 1361 of the trenches 136 can be the outmost row within the cell region 110A. In some embodiments, the row 1361 of the trenches 136 can be the topmost (or bottom most) row from a top view.

In some embodiments, the trenches 136 can have columns 1363 and 1364. In some embodiments, a pitch T3 of the column 1363 of the trenches 136 can be different from a pitch T4 of the column 1364 of the trenches 136. In some embodiments, the pitch T3 of the column 1363 of the trenches 136 can exceed the pitch T4 of the column 1364 of the trenches 136. In some embodiments, the pitch T3 can be substantially twice the pitch T4. In some embodiments, the column 1363 of the trenches 136 can be the outmost column within the cell region 110A. In some embodiments, the column 1363 of the trenches 136 can be the leftmost (or rightmost) column from a top view.

Figure 7A:
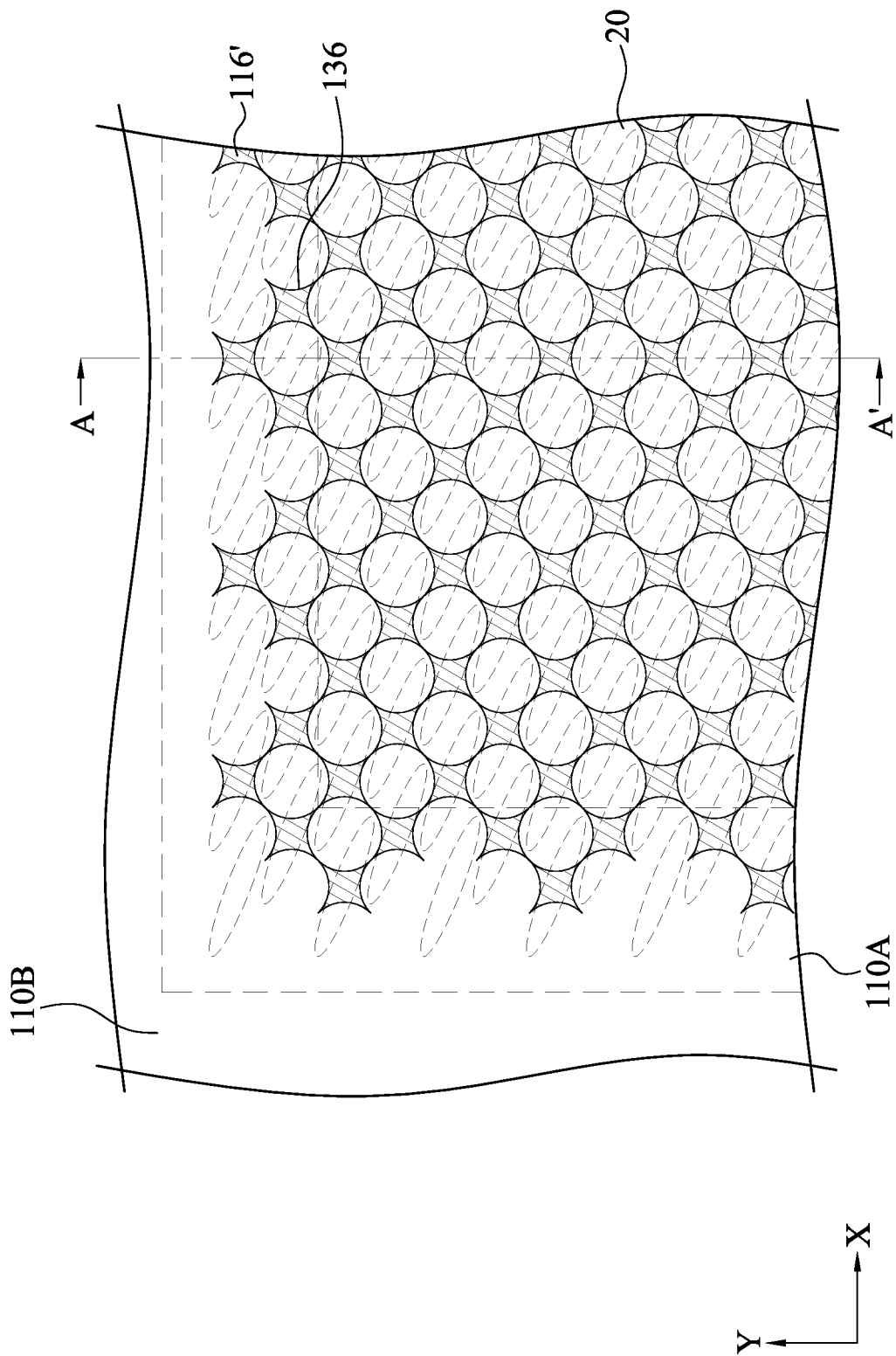
FIG. 7A illustrates one or more stages of an example of a method for manufacturing a semiconductor device according to some embodiments of the present disclosure.
Figure 7B:
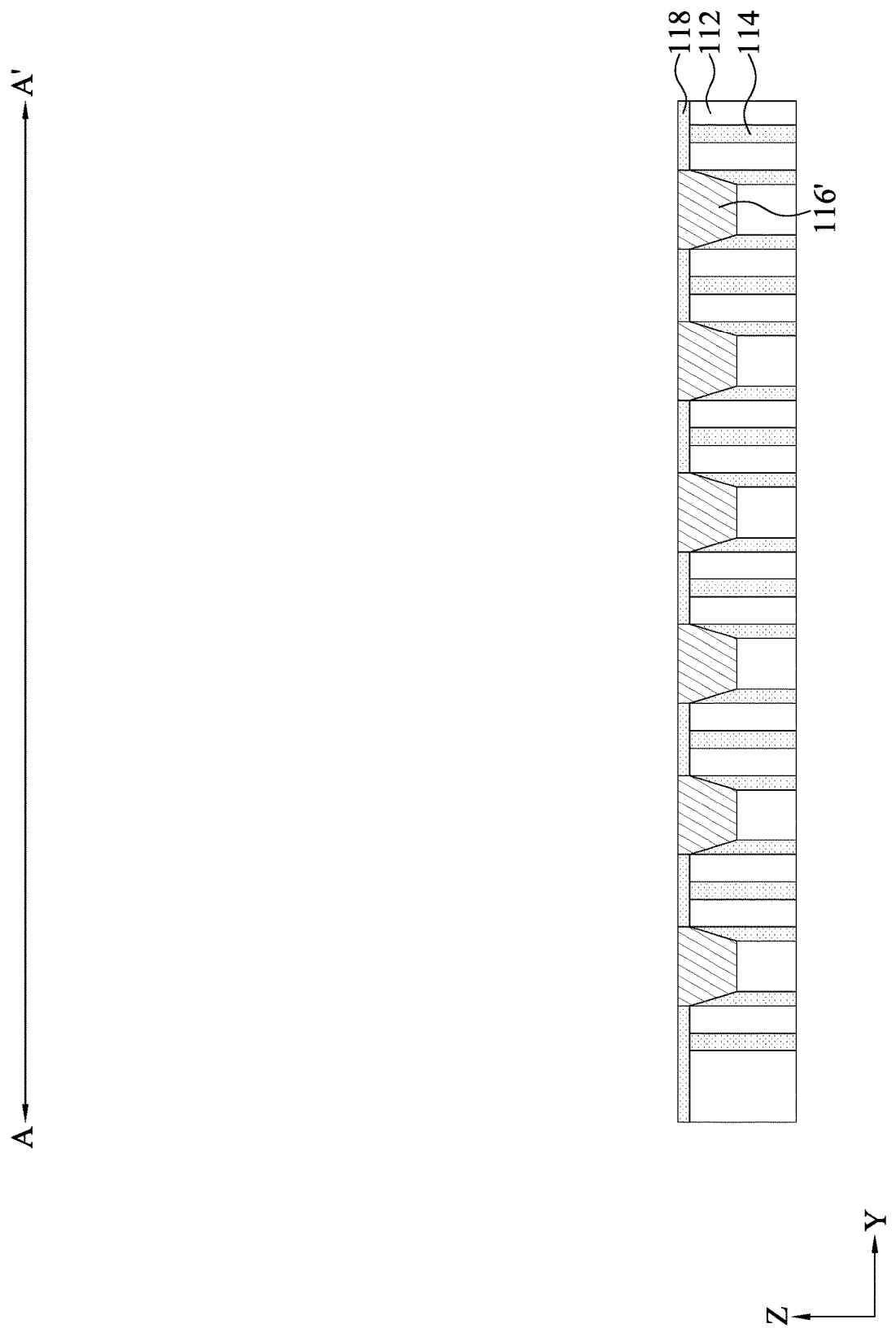
FIG. 7B is a cross-sectional view along line A-A' of FIG. 7A, according to some embodiments of the present disclosure.

Referring to FIG. 7A and FIG. 7B, a conductive layer 116' can be formed. In some embodiments, the conductive layer 116' can fill the trenches 136. In some embodiments, the conductive layer 116' can be surrounded by the dielectric layer 118. In some embodiments, the conductive layer 116' can be formed by CVD, ALD, PVD, LPCVD, or other suitable processes.

Figure 8A:
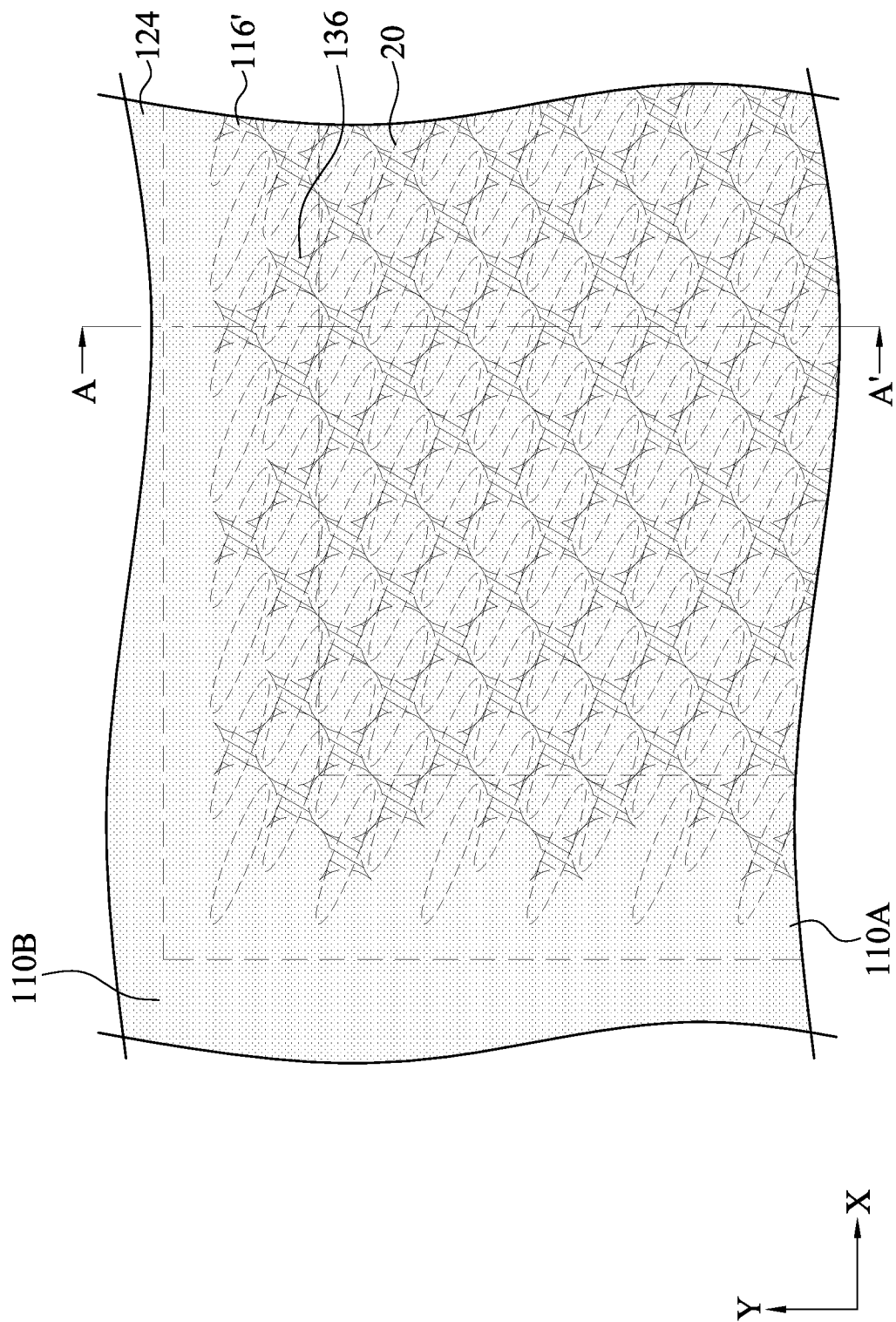
FIG. 8A illustrates one or more stages of an example of a method for manufacturing a semiconductor device according to some embodiments of the present disclosure.
Figure 8B:
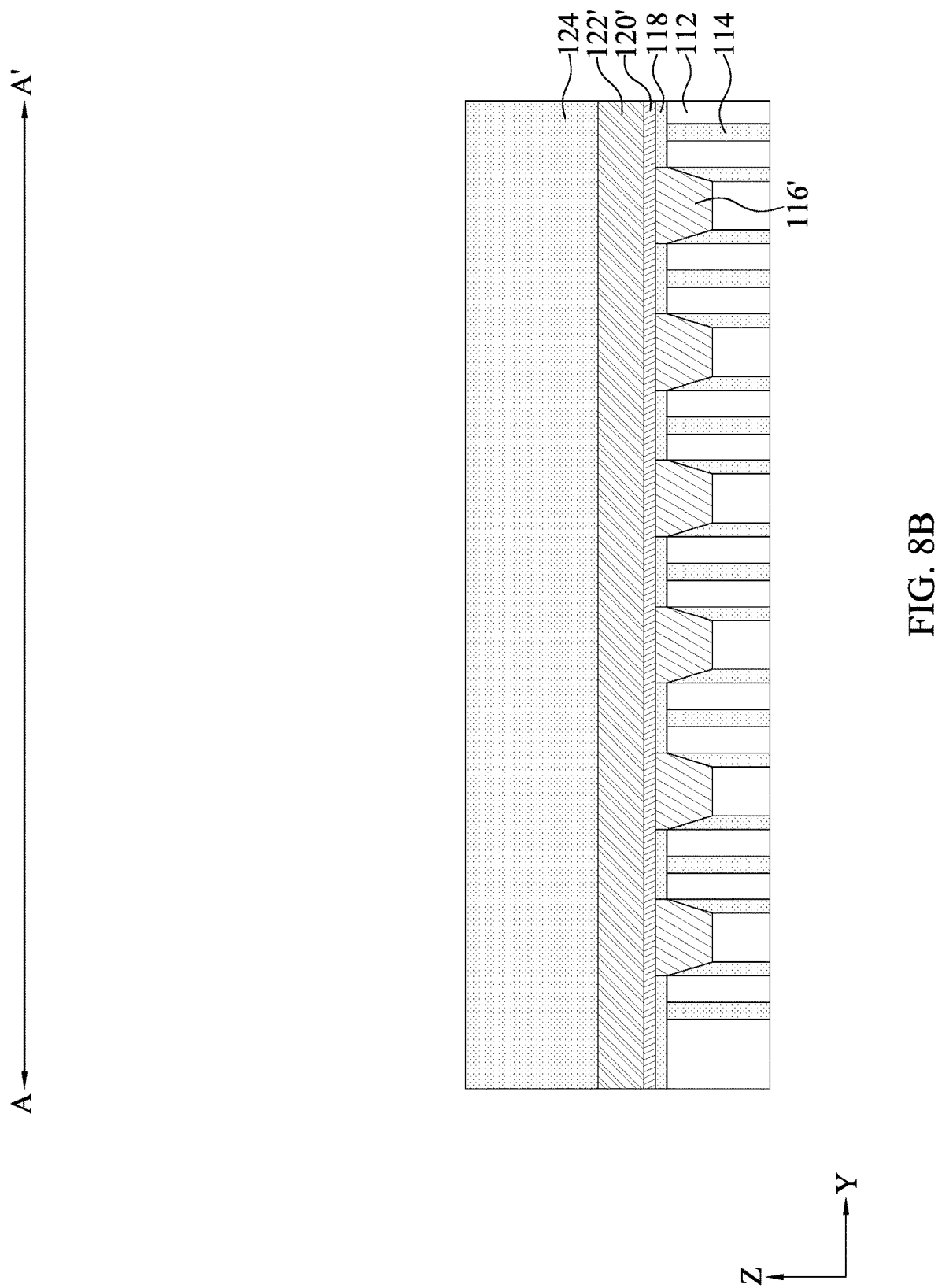
FIG. 8B is a cross-sectional view along line A-A' of FIG. 8A, according to some embodiments of the present disclosure.

Referring to FIG. 8A and FIG. 8B, a barrier layer 120', a metallization layer 122', and a dielectric layer 124 can be formed. The barrier layer 120' can be formed by CVD, ALD, PVD, LPCVD, or other suitable processes. The metallization layer 122' can be formed by CVD, ALD, PVD, LPCVD, or other suitable processes. The dielectric layer 124 can be formed by CVD, ALD, PVD, LPCVD, or other suitable processes.

In some embodiments, the barrier layer 120' can cover the substrate 112. In some embodiments, the barrier layer 120' can cover the dielectric layer 118.

In some embodiments, the metallization layer 122' can be configured to form bit lines 122. In some embodiments, the metallization layer 122' can cover the barrier layer 120'.

In some embodiments, the dielectric layer 124 can cover the metallization layer 122'.

Figure 9A:
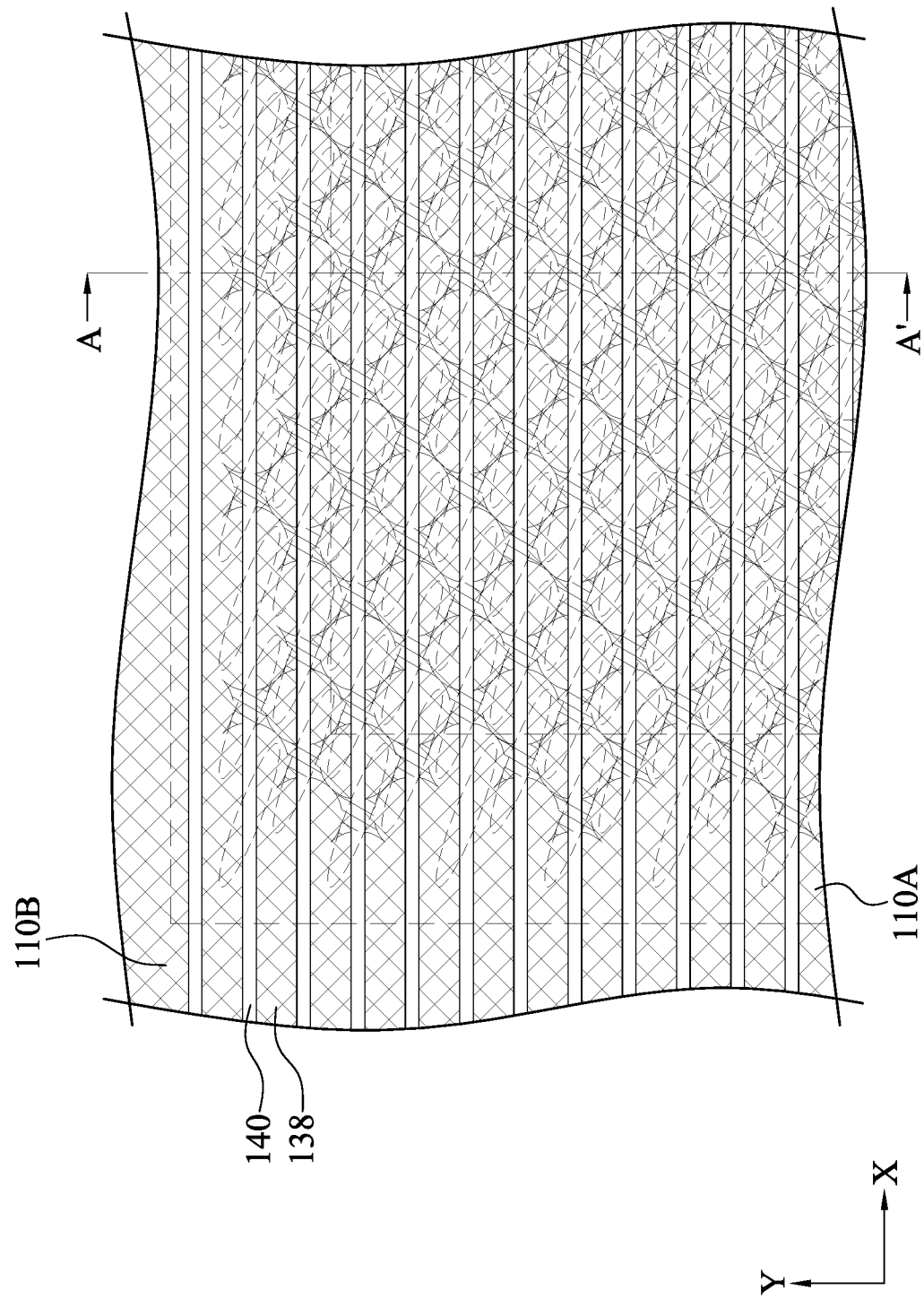
FIG. 9A illustrates one or more stages of an example of a method for manufacturing a semiconductor device according to some embodiments of the present disclosure.
Figure 9B:
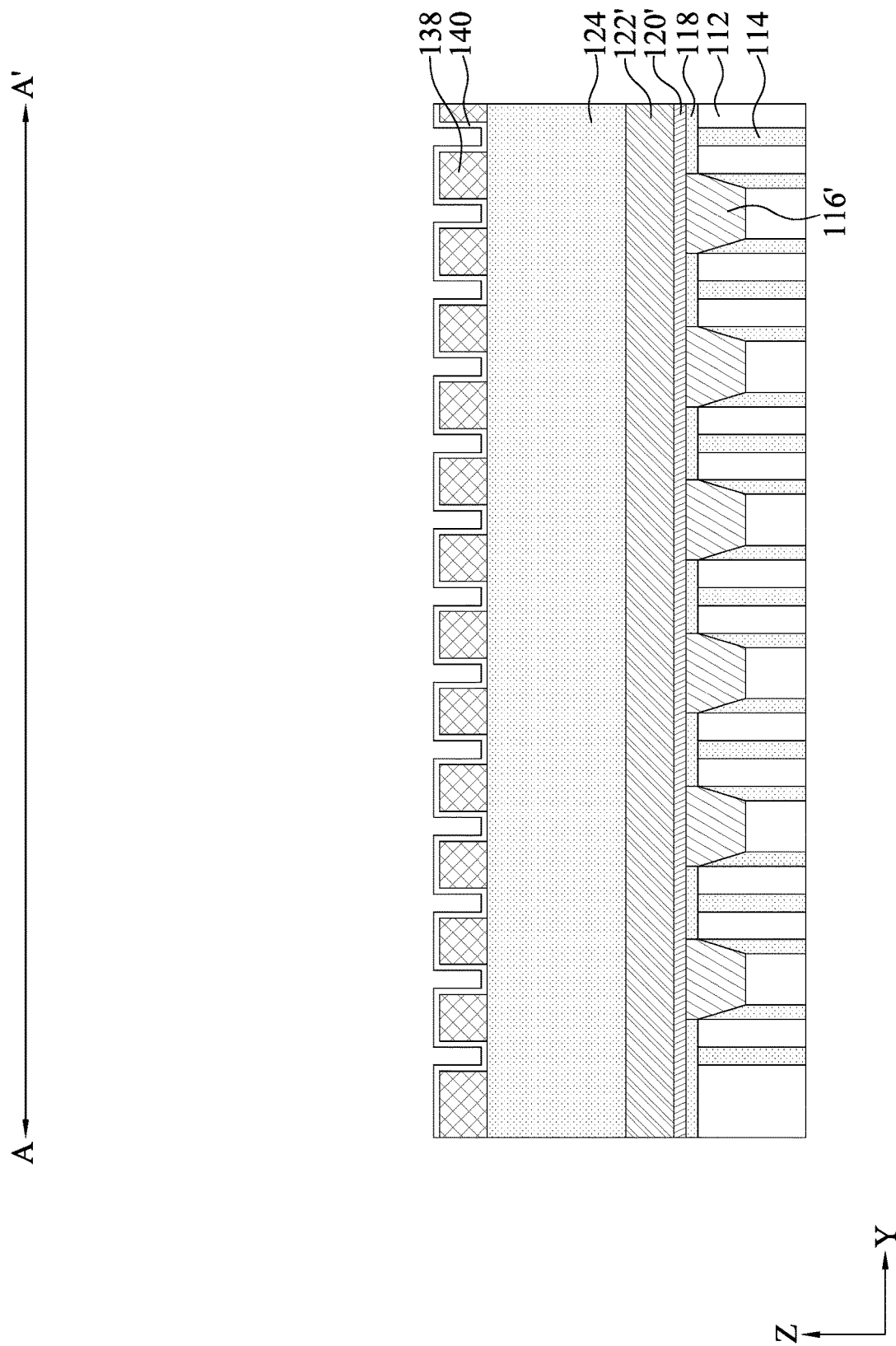
FIG. 9B is a cross-sectional view along line A-A' of FIG. 9B, according to some embodiments of the present disclosure.

Referring to FIG. 9A and FIG. 9B, mask structures 138 and a pitch adjustment structure 140 can be formed. In some embodiments, the mask structures 138 can cover the dielectric layer 124.

In some embodiments, a portion of the conductive layer 116' can be free from vertically overlapping the mask structures 138. In some embodiments, the pitch adjustment structure 140 can be conformally formed on the mask structures 138. In some embodiments, the pitch adjustment structure 140 can be utilized to reduce the aperture defined by the mask structures 138. In some embodiments, a portion of the pitch adjustment structure 140 can be disposed between the openings defined by the mask structures 138.

Figure 10A:
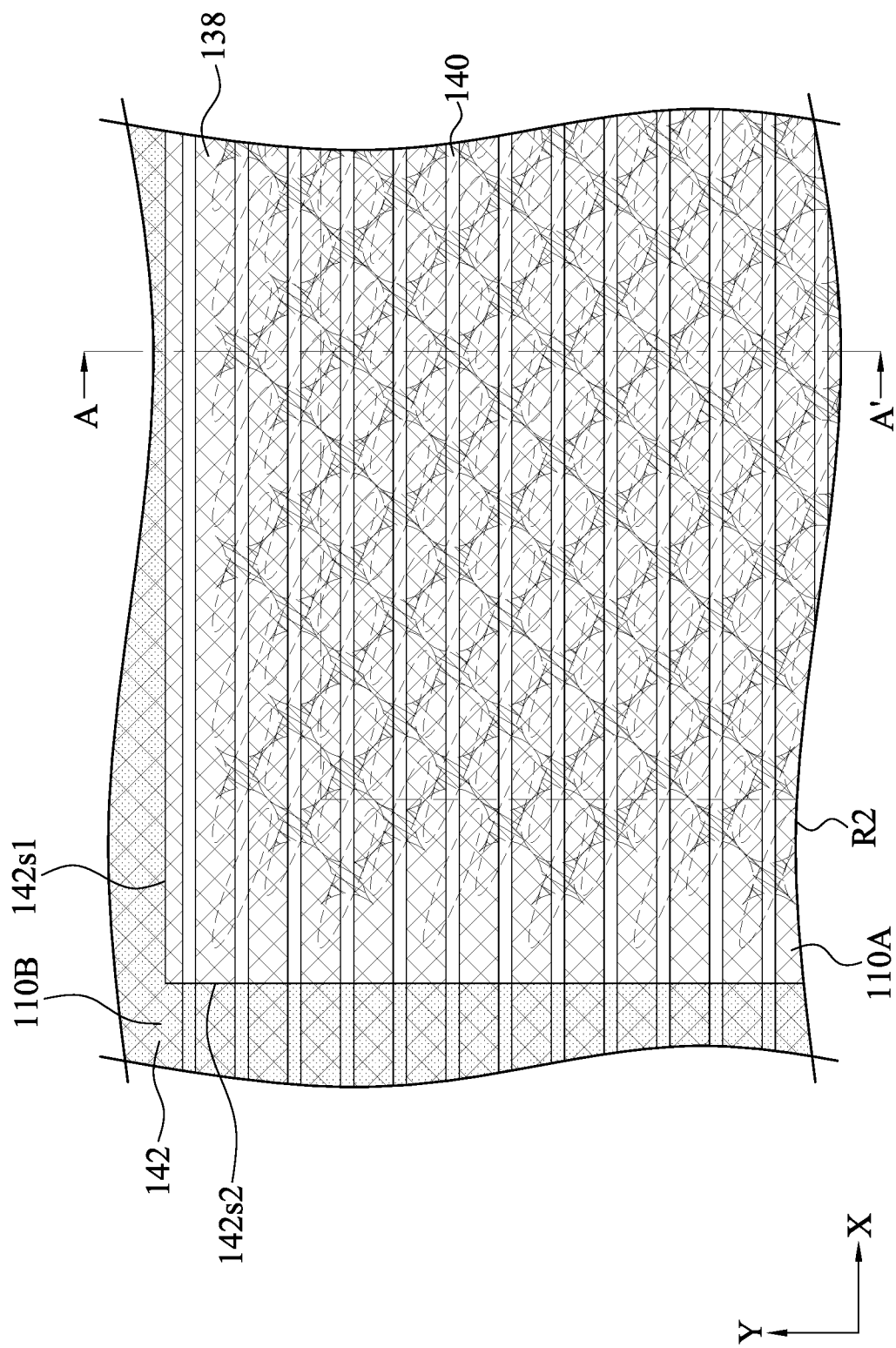
FIG. 10A illustrates one or more stages of an example of a method for manufacturing a semiconductor device according to some embodiments of the present disclosure.
Figure 10B:
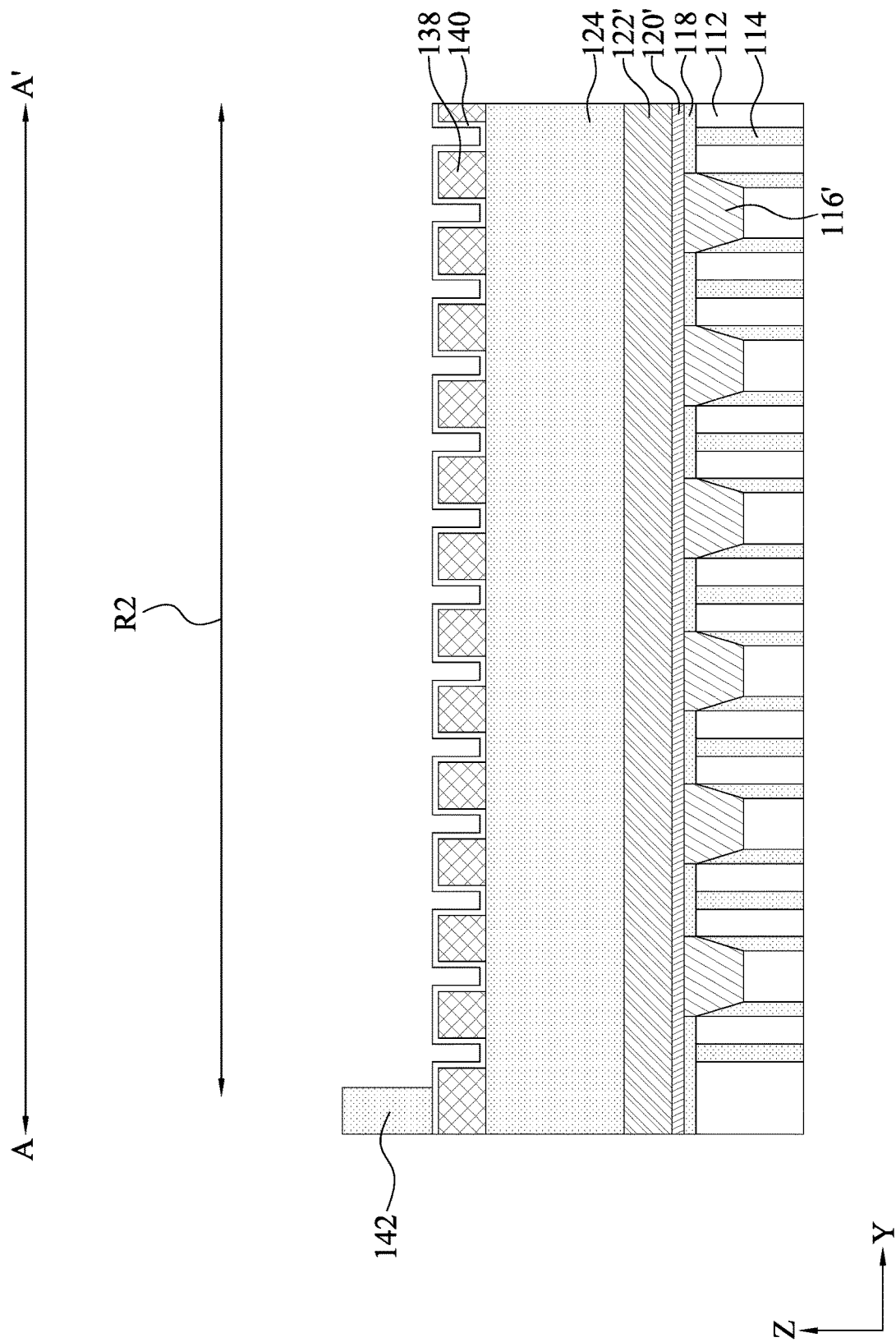
FIG. 10B is a cross-sectional view along line A-A' of FIG. 10A, according to some embodiments of the present disclosure.

Referring to FIG. 10A and FIG. 10B, a protective layer 142 can be formed. In some embodiments, the protective layer 142 can be utilized to define a region R2 to be etched subsequently. In some embodiments, the region R2 can be rectangular or square.

In some embodiments, a portion of the substrate 112 can be exposed by the protective layer 142. In some embodiments, a portion of the mask structures 138 can be exposed by the protective layer 142. In some embodiments, a portion of the pitch adjustment structure 140 can be exposed by the protective layer 142.

In some embodiments, the protective layer 142 can include a side 142s1 and a side 142s2 substantially perpendicular thereto. In some embodiments, the side 134s1 of the protective layer 134 (shown in FIG. 5A) can be slanted with respect to the side 142s1 of the protective layer 142. In some embodiments, the side 134s1 of the protective layer 134 can be slanted with respect to the side 142s2 of the protective layer 142. In some embodiments, the side 134s2 of the protective layer 134 can be slanted with respect to the side 142s1 of the protective layer 142. In some embodiments, the side 134s2 of the protective layer 134 can be slanted with respect to the side 142s2 of the protective layer 142.

Figure 11A:
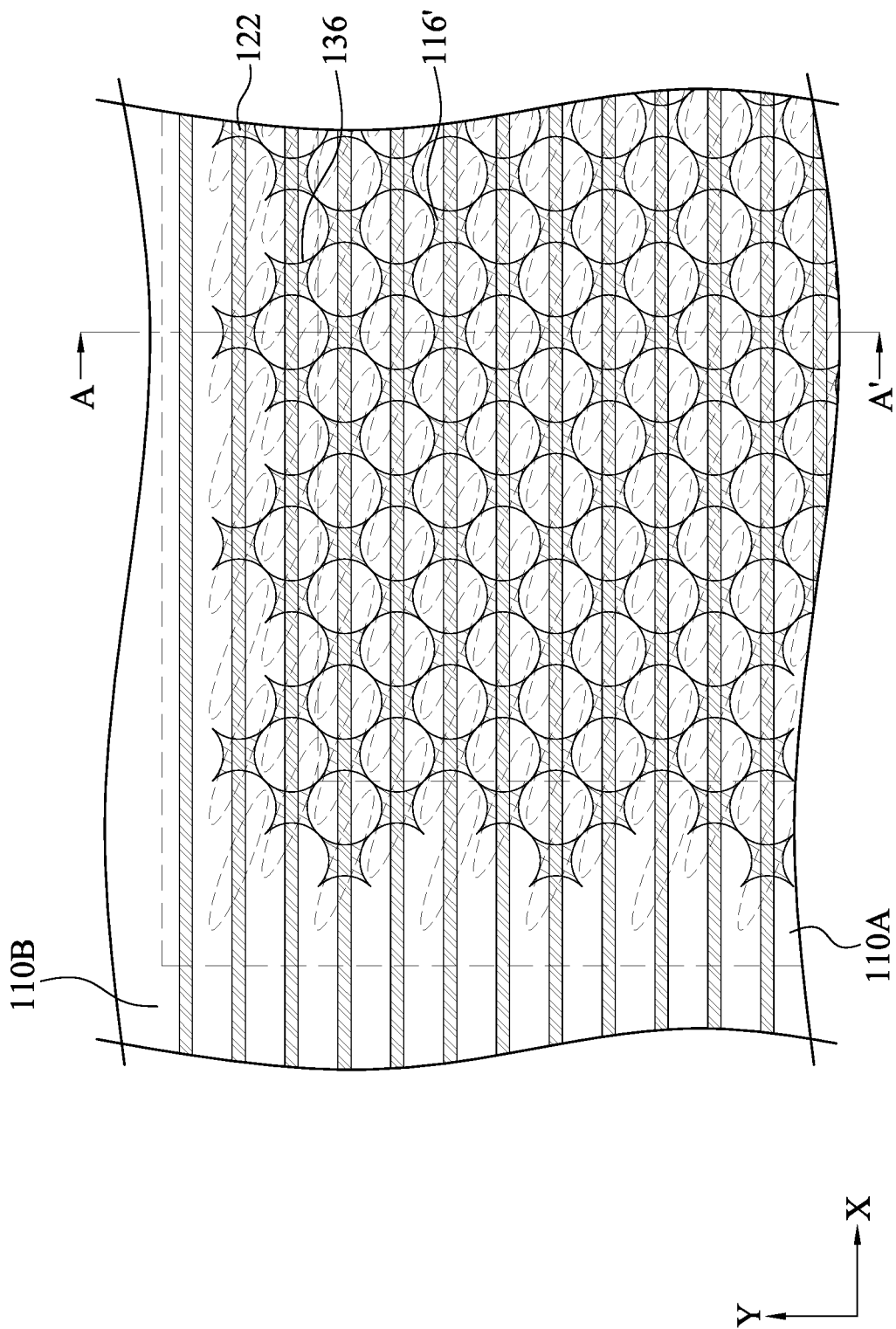
FIG. 11A illustrates one or more stages of an example of a method for manufacturing a semiconductor device according to some embodiments of the present disclosure.
Figure 11B:
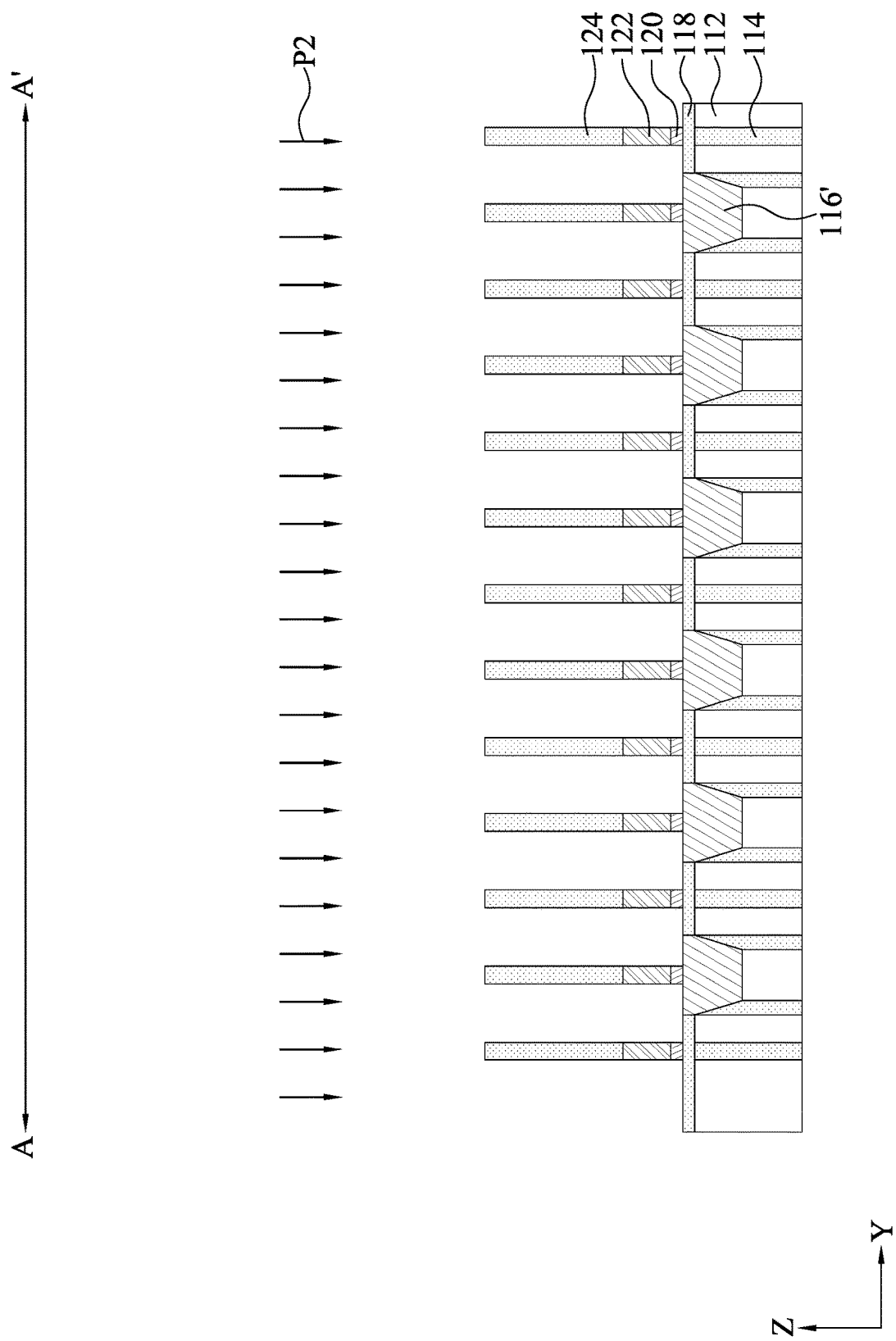
FIG. 11B is a cross-sectional view along line A-A' of FIG. 11A, according to some embodiments of the present disclosure.

Referring to FIG. 11A and FIG. 11B, an etching process P2 is performed. The etching process P2 can include a dry etching, a wet etching, or other suitable etching processes. In some embodiments, the dielectric layer 124 exposed by the protective layer 142 and exposed by the mask structures 138 can be removed.

In some embodiments, the metallization layer 122' exposed by the protective layer 142 and exposed by the mask structures 138 can be removed, thereby forming bit lines 122. At least one of the bit lines 122 can extend along the X direction.

In some embodiments, the barrier layer 120' exposed by the protective layer 142 and exposed by the mask structures 138 can be removed, thereby forming bit line stacks 120. At least one of the bit line stacks 120 can extend along the X direction.

In some embodiments, the protective layer 142 can be removed after the etching process P2. In some embodiments, the mask structures 138 can be removed after the etching process P2. In some embodiments, the pitch adjustment layer can be removed after the etching process P2.

In some embodiments, a portion of the conductive layer 116' can be exposed by the bit line stacks 120. In some embodiments, the portion of the conductive layer 116' can be exposed by the bit lines 122. In some embodiments, the portion of the conductive layer 116' can be exposed by the dielectric layer 124.

In some embodiments, a portion of the bit lines 122 can be disposed over the conductive layer 116'. In some embodiments, a portion of the bit line stack 120 can be disposed over the conductive layer 116'. In some embodiments, a portion of the bit lines 122 can be disposed over the isolation structures 114.

Figure 12A:
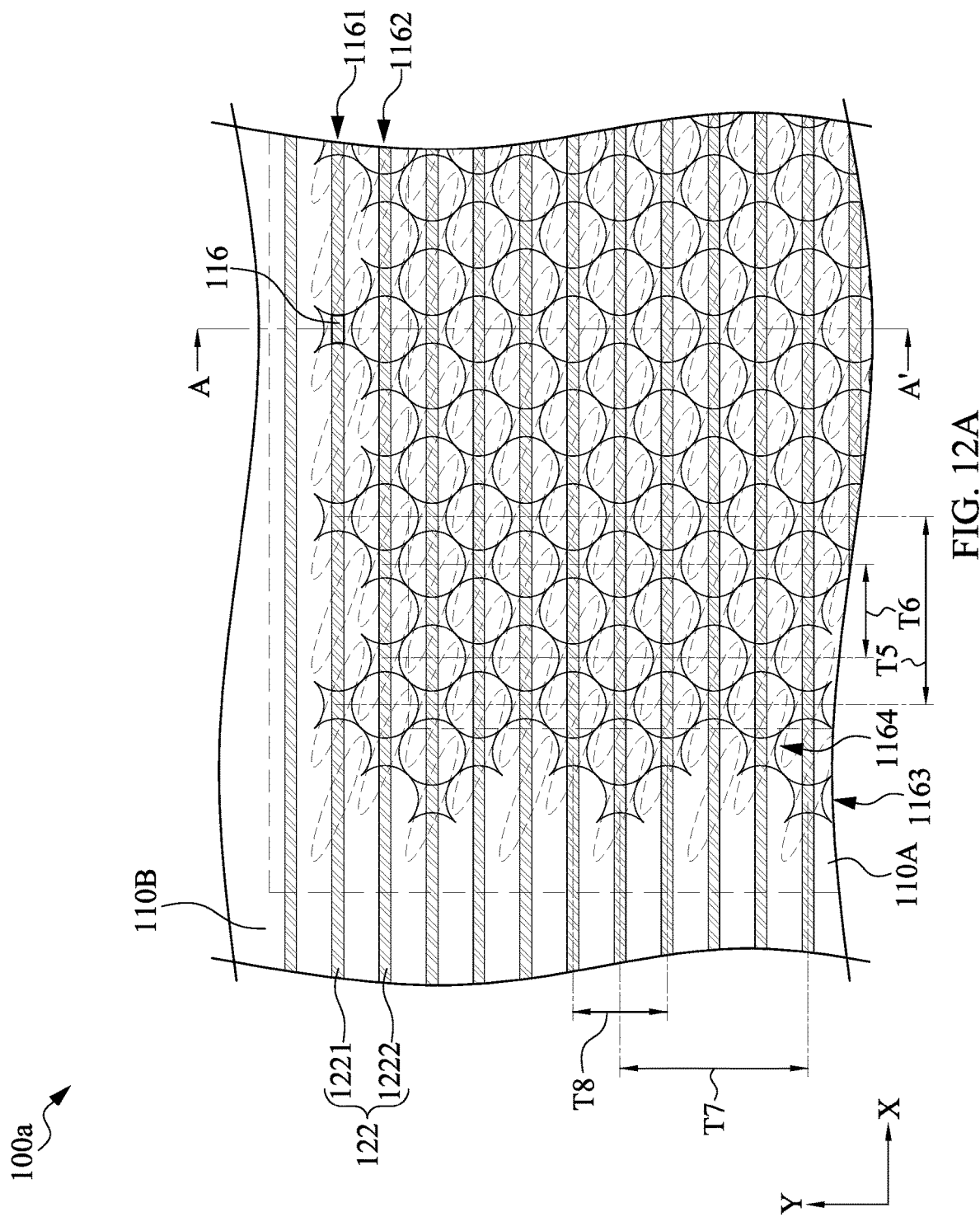
FIG. 12A illustrates one or more stages of an example of a method for manufacturing a semiconductor device according to some embodiments of the present disclosure.
Figure 12B:
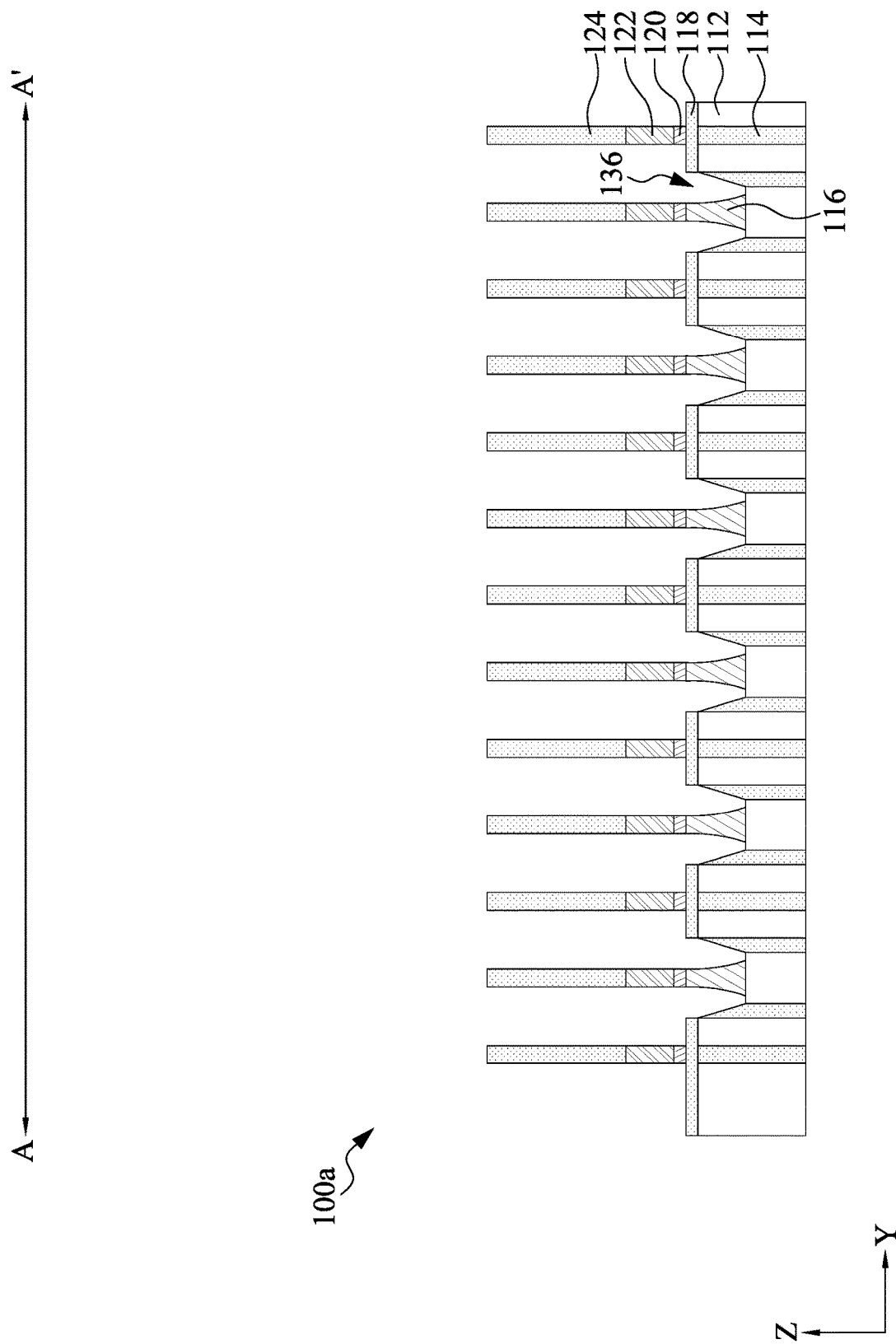
FIG. 12B is a cross-sectional view along line A-A' of FIG. 12A, according to some embodiments of the present disclosure.

Referring to FIG. 12A and FIG. 12B, a portion of the conductive layer 116' is removed, thereby forming bit line contacts 116. As a result, a semiconductor device 100a can be produced.

In some embodiments, the portion of the conductive layer 116' exposed by the bit lines 122 can be removed. In some embodiments, the portion of the conductive layer 116' exposed by the dielectric layer 124 can be removed.

At least one of the bit line contacts 116 can be connected by a corresponding bit line 122. In some embodiments, the bit line contacts 116 can have rows 1161 and 1162. In some embodiments, the bit line contacts 116 in the row 1161 can be connected by a bit line 1221. In some embodiments, the bit line contacts 116 in the row 1162 can be connected by a bit line 1222.

In some embodiments, a pitch T5 of the row 1161 of the bit line contacts 116 can be different from a pitch T6 of the row 1162 of the bit line contacts 116. In some embodiments, the pitch T5 of the row 1161 of the bit line contacts 116 can exceed the pitch T6 of the row 1162 of the bit line contacts 116. In some embodiments, the pitch T5 can be substantially twice the pitch T6. In some embodiments, the row 1161 of the bit line contacts 116 can be the outmost row within the cell region 110A. In some embodiments, the row 1161 of the bit line contacts 116 can be the topmost (or bottom most) row from a top view.

In some embodiments, the bit line contacts 116 can have columns 1163 and 1164. In some embodiments, a pitch T7 of the column 1163 of the bit line contacts 116 can be different from a pitch T8 of the column 1164 of the bit line contacts 116. In some embodiments, the pitch T7 of the column 1163 of the bit line contacts 116 can exceed the pitch T8 of the column 1164 of the bit line contacts 116. In some embodiments, the pitch T7 can be substantially twice the pitch T8. In some embodiments, the column 1163 of the bit line contacts 116 can be the outmost column within the cell region 110A. In some embodiments, the column 1163 of the bit line contacts 116 can be the leftmost (or rightmost) column from a top view.

In this embodiment, a protective layer 132 with a specific profile, such as a zigzag shape, is utilized to define a region R1 on which an etching process P1 is performed. By using the aforesaid protective layer, the trench 136 in the outmost row (or column) can have an integral profile compared to an inner trench. As a result, isolation spacers (shown in FIG. 13) can be formed on both sides of the bit line contact 116 in the outmost column (or row), thereby preventing an electrical short between the bit line 122 and the capacitor contact (shown in FIG. 13).

Figure 13:
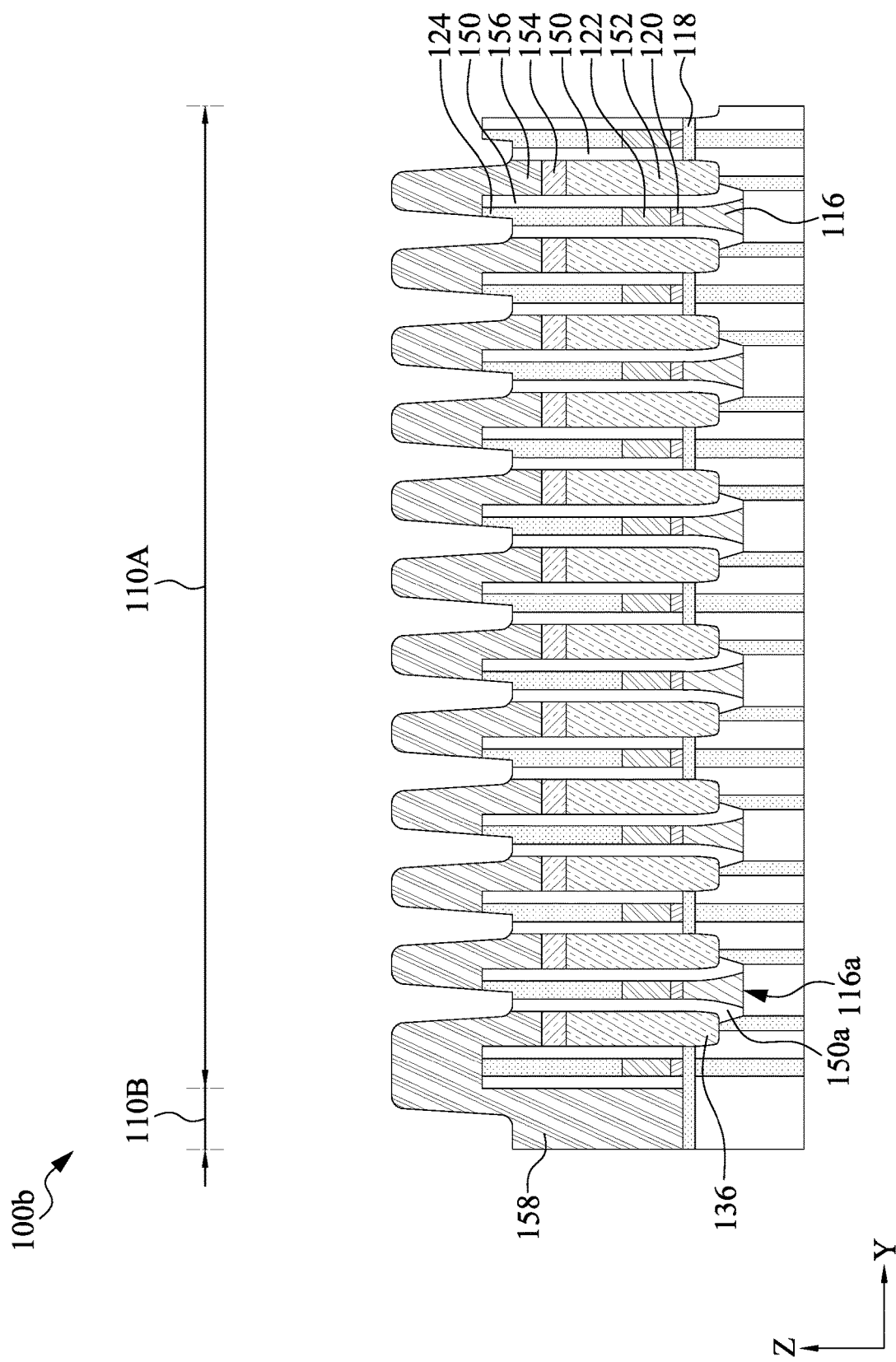
FIG. 13 is a cross-sectional view of a semiconductor device, in accordance with some embodiments of the present disclosure.

FIG. 13 is a cross-section of a semiconductor device 100b, in accordance with some embodiments of the present disclosure. The semiconductor device 100b is similar to semiconductor device 100a except that the semiconductor device 100b can further include an isolation spacer 150, a capacitor contact 152, a stack structure 154, a conductive layer 156, and a moat 158. The semiconductor device 100b can be formed by performing various processes, such as deposition, etching, photolithography, or other suitable process on the semiconductor device 100a.

In some embodiments, the isolation spacer 150 can be disposed on the sidewall of the bit line contact 116, bit line stack 120, bit line 122, and dielectric layer 124. In some embodiments, the bit line contact 116 can be spaced apart from the capacitor contact 152 by the isolation spacer 150.

In some embodiments, the bit line stack 120 can be spaced apart from the capacitor contact 152 by the isolation spacer 150. In some embodiments, the bit line 122 can be spaced apart from the capacitor contact 152 by the isolation spacer 150.

In some embodiments, the isolation spacer 150 can include, for example, silicon oxide ($SiO_2$), silicon nitride ($Si_3N_4$), silicon oxynitride ($N_2OSi_2$), silicon nitride oxide ($N_2OSi_2$), a high-k material or combinations thereof. Examples of the high-k material include a dielectric material having a dielectric constant higher than that of silicon dioxide ($SiO_2$), or a dielectric material having a dielectric constant higher than about 3.9. In some embodiments, the isolation spacer 150 can include at least one metallic element, such as hafnium oxide ($HfO_2$), silicon doped hafnium oxide (HSO), lanthanum oxide ($La_2O_3$), lanthanum aluminum oxide ($LaAlO_3$), zirconium oxide ($ZrO_2$), zirconium orthosilicate ($ZrSiO_4$), aluminum oxide ($Al_2O_3$) or combinations thereof.

In some embodiments, the capacitor contact 152 can be disposed on the substrate 112. In some embodiments, the capacitor contact 152 can be disposed between the isolation spacers 150. In some embodiments, a portion of the capacitor contact 152 can be located within the trench defined by the substrate 112. In some embodiments, the capacitor contact 152 can include metal, such as W, Cu, Ru, Ir, Ni, Os, Rh, Al, Mo, Co, alloys thereof, combinations thereof or any metallic material with suitable resistance and gap-fill capability.

In some embodiments, the stack structure 154 can be disposed on the capacitor contact 152. In some embodiments, the stack structure 154 can include a multilayered structure. In some embodiments, the stack structure 154 can include, for example, metal silicide layer (e.g., $CoSi_x$), metal nitride layer (e.g., TiN), and other suitable layers.

In some embodiments, the conductive layer 156 can be disposed on the stack structure 154. The conductive layer 156 can be utilized to, for example, connect the capacitor structures (not shown) and the capacitor contact 152. In some embodiments, the conductive layer 156 can cover the isolation spacer 150 and the dielectric layer 124. In some embodiments, the conductive layer 156 can include metal, such as W, Cu, Ru, Ir, Ni, Os, Rh, Al, Mo, Co, alloys thereof, or a combination thereof.

In some embodiments, the moat 158 can be disposed at a boundary between the cell region 110A and the peripheral region 110B. The moat 158 can be utilized to, for example, protect the peripheral region 100B from defects. The moat 158 can be across the cell region 100A and the peripheral region 1008. The material of the moat 158 can be the same as that of the conductive layer 156.

In this embodiment, the trench in the outmost row (or column) can have the same integral profile as an inner trench. In a comparative semiconductor device, the trench in the outmost row (or column) may have merely a half profile in comparison with an inner one, resulting in the bit line contact with only one side isolation spacer formed thereon. Another side of bit line contact may abut the active area of the substrate. As a result, electrical leakage may occur from the bit line to the moat through the bit line stack, the bit line contact, the active area of the substrate, and the capacitor contact. In this embodiment, since the trench 136 in the outmost row (or column) has an integral profile, isolation spacers (e.g., 150a) can be formed on both sides of the bit line contact 116a, which is located in the trench 136 of the outmost row (or column). Therefore, electrical leakage between the bit line 122 and the capacitor contact 152 can be prevented.

One aspect of the present disclosure provides a method of manufacturing a semiconductor device. The method includes providing a substrate including a plurality of active areas separated from each other. The method also includes forming first mask structures on the substrate. The method further includes forming a first protective layer covering the first mask structures and the substrate. The first protective layer defines an area exposing a portion of the first mask structures and the substrate, and the area defined by the first protective layer has a zigzag edge in a top view. In addition, the method includes performing a first etching process to remove a portion of the substrate exposed from the first mask structures and the first protective layer to form trenches.

Another aspect of the present disclosure provides another method of manufacturing a semiconductor device. The method includes providing a substrate including a plurality of active areas separated from each other. The method also includes forming first mask structures on the substrate. The method further includes forming a first protective layer covering the first mask structures and the substrate. The first protective layer defines a first region exposing the first mask structures and the substrate. A portion of the first mask structures is partially covered by the first protective layer. In addition, the method includes performing a first etching process to remove a portion of the substrate exposed from the first mask structures and the first protective layer to form trenches.

Another aspect of the present disclosure provides a semiconductor device. The semiconductor device includes a substrate and a plurality of bit line contacts. The substrate defines a plurality of trenches. The plurality of bit line contacts are disposed on the substrate. At least one of the plurality of bit line contacts is disposed within one of the trenches defined by the substrate. The plurality of trenches has a first row and a second row, and a pitch of the first row is different from a pitch of the second row.

The embodiments of the present disclosure illustrate a semiconductor device with bit line contacts. In this embodiment, the outmost row bit line contact can have an integral profile. In this embodiment, the isolation spacer abutting the bit line contact can have an integral profile, thereby preventing an electrical short between the bit line and the capacitor contact or the moat.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method of manufacturing a semiconductor device, comprising:
providing a substrate comprising a plurality of active areas separated from each other;
forming first mask structures on the substrate;
forming a first protective layer covering the first mask structures and the substrate, wherein the first protective layer defines an area exposing a portion of the first mask structures and the substrate, and the area defined by the first protective layer has a zigzag edge in a top view; and
performing a first etching process to form trenches defined by the substrate.

2. The method of claim 1, wherein a portion of first mask structures is partially covered by the first protective layer, and the first protective layer comprises a photosensitive material.

3. The method of claim 1, wherein at least one of the plurality of active areas has a part surrounded by the first mask structures, and the part of at least one of the active areas is free from intersecting the first protective layer in the top view.

4. The method of claim 1, wherein the trenches comprise a first row and a second row, and a pitch of the first row of the trenches is different from a pitch of the second row of the trenches.

5. The method of claim 4, wherein the pitch of the first row of the trenches is greater than the pitch of the second row of the trenches, and the first row of the trenches is the outmost row of the trenches.

6. The method of claim 1, wherein the trenches comprise a first column and a second column, and a pitch of the first column of the trenches is different from a pitch of the second column of the trenches.

7. The method of claim 6, wherein the pitch of the first column of the trenches is greater than the pitch of the second column of the trenches, and the first column of the trenches is the outmost column of the trenches.

8. The method of claim 1, further comprising:
forming a conductive layer filling the trenches;
forming a metallization layer on the conductive layer;
forming second mask structures on the metallization layer; and
performing a second etching process to remove a portion of the metallization layer to form bit lines.

9. The method of claim 8, further comprising:
forming a second protective layer to define a region exposing a portion of the second mask structures, and the region defined by the second protective layer has a rectangle shape or a square shape.

10. The method of claim 9, further comprising:
removing a portion of the conductive layer to form bit line contacts;
wherein the bit line contacts comprise a first row and a second row, and a pitch of the first row of the bit line contacts is different from a pitch of the second row of the bit line contacts.

11. The method of claim 10, wherein the pitch of the first row of the bit line contacts is greater than the pitch of the second row of the bit line contacts, and the first row is the outmost row of the bit line contacts.

12. The method of claim 10, wherein the bit line contacts comprise a first column and a second column, and a pitch of the first column of the bit line contacts is different from a pitch of the second column of the bit line contacts.

13. The method of claim 12, wherein the pitch of the first column of the bit line contacts is greater than the pitch of the second column of the bit line contacts.

14. A method of manufacturing a semiconductor device, comprising:
providing a substrate comprising a plurality of active areas separated from each other;
forming first mask structures on the substrate;
forming a first protective layer covering the first mask structures and the substrate, wherein the first protective layer defines a first region exposing the first mask structures and the substrate, and a portion of the first mask structures is partially covered by the first protective layer;
performing a first etching process to remove the substrate exposed from the first mask structures and from the first region to form trenches.

15. The method of claim 14, wherein the first protective layer has a first side extending along a first direction, and the first side of the first protective layer intersects the portion of the first mask structures in a top view.

16. The method of claim 15, wherein the first protective layer has a second side extending along a second direction different from the first direction, the second side of the first protective layer intersects the portion of the first mask structures in the top view, and wherein at least one of the plurality of active areas has a part free from overlapping the first mask structures in the top view, the part of at least one of the active areas is free from intersecting the first side of the first protective layer in the top view, and the part of at least one of the active areas is free from intersecting the second side of the first protective layer in the top view.

17. The method of claim 15, further comprising:
   forming a conductive layer filling the trenches;
   forming a metallization layer on the conductive layer;
   forming second mask structures on the metallization layer;
   performing a second etching process to remove a portion of the metallization layer to form bit lines;
   forming a second protective layer to cover the second mask structures, wherein the second protective layer defines a second region exposing a portion of the second mask structures, and a profile of the second region is different from a profile of the first region; and
   removing a portion of the metallization layer to form bit line contacts.

18. The method of claim 17, wherein the second protective layer has a third side and a fourth side different from the third side, and both of the third side and the fourth side of the second protective layer are slanted with respect to the first side of the first protective layer.

19. The method of claim 18, wherein both of the third side and the fourth side of the second protective layer are slanted with respect to the second side of the first protective layer.

20. The method of claim 17, further comprising:
   forming a pitch adjustment structure on the second mask structures and on the metallization layer, wherein the trenches comprise a first row and a second row, and a pitch of the first row of the trenches is different from a pitch of the second row of the trenches.

* * * * *